(12) United States Patent
Ma et al.

(10) Patent No.: US 10,944,427 B2
(45) Date of Patent: Mar. 9, 2021

(54) DATA TRANSMISSION METHOD, SENDING DEVICE, AND RECEIVING DEVICE

(71) Applicant: HUAWEI TECHNOLOGIES CO., LTD., Guangdong (CN)

(72) Inventors: Liang Ma, Shanghai (CN); Yuejun Wei, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/436,912

(22) Filed: Jun. 10, 2019

(65) Prior Publication Data
US 2019/0296768 A1 Sep. 26, 2019

Related U.S. Application Data

(63) Continuation of application No. PCT/CN2016/112463, filed on Dec. 27, 2016.

(51) Int. Cl.
*H03M 13/11* (2006.01)
*H03M 13/09* (2006.01)
(Continued)

(52) U.S. Cl.
CPC ..... *H03M 13/1168* (2013.01); *H03M 13/093* (2013.01); *H03M 13/114* (2013.01);
(Continued)

(58) Field of Classification Search
CPC .......... H03M 13/1168; H03M 13/116; H03M 13/3723; H03M 13/093; H03M 13/114;
(Continued)

(56) References Cited

U.S. PATENT DOCUMENTS

| 7,669,103 B2 | 2/2010 | Soljanin et al. |
| 9,203,434 B1 | 12/2015 | Garani |

(Continued)

FOREIGN PATENT DOCUMENTS

| CN | 101047392 A | 10/2007 |
| CN | 101741516 A | 6/2010 |

(Continued)

OTHER PUBLICATIONS

R1-1613027 MediaTek Inc. ,"High performance and area efficient LDPC code design with compact protomatrix",3GPP TSG-RAN WG1 #87,Reno, Nevada, Nov. 14-18, 2016,total 9 pages.

(Continued)

*Primary Examiner* — James C Kerveros
(74) *Attorney, Agent, or Firm* — Womble Bond Dickinson (US) LLP

(57) ABSTRACT

A data transmission method, a sending device, and a receiving device are provided. A sending device obtains information data, encodes the information data by using a quasi-cyclic low-density parity-check (LDPC) code matrix, modulates the encoded data to obtain first data, and sends the first data. A receiving device obtains second data, demodulates the second data to obtain to-be-decoded data, and decodes the to-be-decoded data by using a block matrix in an LDPC code matrix, where the block matrix is a submatrix in the quasi-cyclic LDPC matrix, and in the quasi-cyclic LDPC matrix, a row weight of a row (H−1) is greater than or equal to a row weight of a row H, or a row weight of a row (H−1) is less than or equal to a row weight of a row H. In this way, decoding efficiency can be improved.

17 Claims, 16 Drawing Sheets

(51) Int. Cl.
*H03M 13/37* (2006.01)
*H04L 1/00* (2006.01)

(52) U.S. Cl.
CPC ..... *H03M 13/116* (2013.01); *H03M 13/3723* (2013.01); *H03M 13/3761* (2013.01); *H04L 1/0058* (2013.01)

(58) Field of Classification Search
CPC ......... H03M 13/3761; H03M 13/1105; H03M 13/1148; H03M 13/6502; H04L 1/0058
USPC .......................................................... 714/752
See application file for complete search history.

(56) References Cited

U.S. PATENT DOCUMENTS

| | | | | |
|---|---|---|---|---|
| 2005/0283708 | A1* | 12/2005 | Kyung | H03M 13/6393 714/758 |
| 2007/0260957 | A1* | 11/2007 | Soljanin | H04L 1/0002 714/752 |
| 2008/0028273 | A1 | 1/2008 | Jeong et al. | |
| 2008/0155385 | A1 | 6/2008 | Jeong et al. | |
| 2008/0294963 | A1* | 11/2008 | Hwang | H03M 13/036 714/755 |
| 2012/0297273 | A1* | 11/2012 | Sakaue | H03M 13/1188 714/773 |
| 2014/0173374 | A1* | 6/2014 | Nieminen | H03M 13/276 714/752 |
| 2015/0155888 | A1 | 6/2015 | Moon et al. | |
| 2017/0019211 | A1* | 1/2017 | Noh | H04L 1/0057 |
| 2019/0097656 | A1* | 3/2019 | Bhatia | H03M 13/1177 |
| 2019/0155686 | A1* | 5/2019 | Kumar | H03M 13/2906 |
| 2020/0099397 | A1* | 3/2020 | Shinohara | H03M 13/036 |

FOREIGN PATENT DOCUMENTS

| | | |
|---|---|---|
| CN | 101764677 A | 6/2010 |
| CN | 102710385 A | 10/2012 |
| CN | 104168030 A | 11/2014 |
| CN | 104579576 A | 4/2015 |
| CN | 104618067 A | 5/2015 |
| CN | 105978613 A | 9/2016 |
| JP | 2009503996 A | 1/2009 |
| JP | 2015156531 A | 8/2015 |
| KR | 20100071663 A | 6/2010 |

OTHER PUBLICATIONS

Tsung-Yi Chen et al, Protograph-Based Raptor-Like LDPC Codes for Rate Compatibility with Short Blocklengths. 2011 IEEE Global Telecommunications Conference—Globecom 2011, Jan. 19, 2012, 6 pages.

R. Gallager, Low-density parity-check codes. IRE Transactions on Information Theory ( vol. 8 , Issue: 1 , Jan. 1962 ), 8 pages.

D.E. Hocevar, A reduced complexity decoder architecture via layered decoding of LDPC codes. IEEE Workshop onSignal Processing Systems, 2004. SIPS 2004., Dec. 6, 2004, 6 pages.

* cited by examiner

DATA TRANSMISSION METHOD, SENDING DEVICE, AND RECEIVING DEVICE

CROSS-REFERENCE TO RELATED APPLICATIONS

This application is a continuation of International Application No. PCT/CN2016/112463, filed on Dec. 27, 2016, the disclosure of which is hereby incorporated by reference in its entirety.

TECHNICAL FIELD

This application relates to the field of encoding technologies, and in particular, to a data transmission method, a sending device, and a receiving device.

BACKGROUND

With wide spread of multimedia and broadband mobile communications services, a radio communications system has a higher requirement on a transmission speed and reliability. Due to advantages such as low complexity, a low error floor, and fully-parallel decoding, a low-density parity-check (LDPC) code has been widely applied to a microwave field, an optical network field, a Wi-Fi field, and the like.

An LDPC code was first proposed by Gallager in 1962, and may be understood as a linear block code whose code length is n, information sequence length is k, and check matrix is a sparse matrix. The LDPC code may be uniquely determined by a check matrix (a basis matrix) H of the LDPC code or may be uniquely defined by a Tanner graph corresponding to a check matrix H. For example, $$H = \begin{pmatrix} v_0 & v_1 & v_2 & v_3 & v_4 & v_5 & v_6 & v_7 & v_8 & v_9 \\ 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 1 & 0 & 0 & 1 \\ 0 & 0 & 0 & 1 & 0 & 0 & 0 & 1 & 1 & 1 \end{pmatrix} \begin{matrix} c_0 \\ c_1 \\ c_2 \\ c_3 \\ c_4 \end{matrix} \rightarrow$$

$$\begin{cases} v_0 + v_1 + v_2 + v_3 = 0 \\ v_0 + v_4 + v_5 + v_6 = 0 \\ v_1 + v_4 + v_7 + v_8 = 0 \\ v_2 + v_5 + v_6 + v_9 = 0 \\ v_3 + v_7 + v_8 + v_9 = 0 \end{cases}$$

may be understood as a matrix representation of an LDPC code. In the LDPC code represented by the matrix, check bits $\{v_0\, v_1\, v_2\, v_3\, v_4\, v_5\, v_6\, v_7\, v_8\, v_9\}$ are multiplied by non-zero elements in the check matrix H after being transposed. If a linear block code $$\begin{cases} v_0 + v_1 + v_2 + v_3 = 0 \\ v_0 + v_4 + v_5 + v_6 = 0 \\ v_1 + v_4 + v_7 + v_8 = 0 \\ v_2 + v_5 + v_6 + v_9 = 0 \\ v_3 + v_7 + v_8 + v_9 = 0 \end{cases}$$

is obtained, it may be understood as that decoding succeeds.

The LDPC code represented by the matrix may alternatively be represented by a Tanner graph shown in FIG. 1. In FIG. 1, circular nodes are variable nodes $\{v_0\, v_1\, v_2\, v_3\, v_4\, v_5\, v_6\, v_7\, v_8\, v_9\}$ that represent a column in the matrix H, and square nodes are check nodes $\{c_0\, c_2\, c_3\, c_4\}$ that represent a row in the matrix H. Each line connecting a check node to a variable node in the figure represents that there is a non-zero element at an intersection of a row and a column that are corresponding to the check node and the variable node.

Currently, there are mainly two methods for decoding a quasi-cyclic LDPC matrix: a back propagation (BP) algorithm and a min sum (MS) algorithm. Due to relatively high decoding complexity, generally, BP is only used for theoretically verifying performance. Actually, a system mostly uses the MS decoding method for decoding. A flood MS algorithm and a layered MS algorithm are relatively common MS decoding methods at present. The layered MS algorithm may be understood as an MS decoding method obtained through improvement of the flood MS algorithm. The layered MS algorithm has a relatively high convergence speed, can reduce a quantity of iterations required for decoding, and is a common MS decoding method. However, when the layered MS decoding method is used for decoding, decoding efficiency is still relatively low.

SUMMARY

Embodiments of this application provide a data transmission method, a sending device, and a receiving device, to improve decoding efficiency.

According to a first aspect, a data transmission method is provided. A sending device obtains information data, and encodes the information data by using a quasi-cyclic LDPC matrix in which a row weight of a row (H−1) is greater than or equal to a row weight of a row H or a row weight of a row (H−1) is less than or equal to a row weight of a row H, modulates the encoded information data to obtain first data, and sends the first data. In a decoding process, a receiving device obtains second data, where the second data may be understood as the first data sent by the sending device and transmitted to the receiving device through a channel, and decodes to-be-decoded data by using a block matrix in the quasi-cyclic LDPC matrix. For example, according to a row weight, a block matrix whose row weight is relatively small is selected preferentially for iterative decoding.

In an iteration process, iterative computation is first performed on a row whose row weight is smaller, and then iterative computation is performed on a row whose row weight is larger. This can increase a convergence speed of iteration. Therefore, in the embodiments of this application, by preferentially selecting, according to a row weight, a block matrix whose row weight is relatively small for iterative decoding, a convergence speed of iteration can be increased and decoding efficiency can be improved. In addition, for a high-code-rate LDPC code part, only when confidence of input information of the high-code-rate LDPC code part reaches higher than a preset threshold of the high-code-rate LDPC code part, a convergence solution may be obtained by performing iterative decoding; otherwise, the iteration process is divergent. Therefore, in the embodiments of this application, a block matrix is used for decoding, and when confidence of the block matrix reaches higher than a preset threshold of the block matrix, bit confidence may be increased, and a computing resource can be saved.

H is an integer and $0 \leq H \leq M-1$, and M represents a quantity of rows in the quasi-cyclic LDPC matrix. The block matrix is a submatrix in the quasi-cyclic LDPC matrix. For example, the block matrix may be a core matrix and an expanded matrix in a quasi-cyclic LDPC matrix of a raptor-like structure.

In one embodiment, the quasi-cyclic LDPC matrix in which the row weight of the row (H−1) is less than or equal to the row weight of the row H may be a quasi-cyclic LDPC matrix of a raptor-like structure. The quasi-cyclic LDPC matrix in which the row weight of the row (H−1) is greater than or equal to the row weight of the row H may be a quasi-cyclic LDPC matrix, transposed in a column direction, of a raptor-like structure.

Assuming that the quasi-cyclic LDPC matrix of the raptor-like structure is a matrix of M rows×N columns, a core matrix in the quasi-cyclic LDPC matrix of the raptor-like structure is $M_C$ rows×$N_C$ columns. $M_C$<M, and M, N, $M_C$, and $N_C$ are all positive integers. In the quasi-cyclic LDPC matrix of the raptor-like structure, a block matrix including rows 0 to ($M_C$−1) and columns 0 to ($N_C$−1) is a core matrix and a block matrix including rows $M_C$ to (M−1) and the columns 0 to ($N_C$−1) is an expanded matrix. When decoding the to-be-decoded data by using the block matrix, the receiving device may use the following manners.

In one embodiment, the to-be-decoded data is decoded through a first specified quantity of iterations by using a block matrix including rows $M_C$ to (M−1) and columns 0 to N in the quasi-cyclic LDPC matrix of the raptor-like structure, to obtain intermediate data of iterative decoding. The intermediate data of iterative decoding is decoded through a second specified quantity of iterations by sequentially using a block matrix including rows 0 to ($M_C$−1) and the columns 0 to N and the block matrix including the rows $M_C$ to (M−1) and the columns 0 to N in the quasi-cyclic LDPC matrix of the raptor-like structure. $M_C$<M, $N_C$<N, and M, N, and $M_C$ are all positive integers.

The quasi-cyclic LDPC matrix of the raptor-like structure used for decoding the to-be-decoded data may be a quasi-cyclic LDPC matrix in which a row weight of a row (H−1) is less than or equal to a row weight of a row H.

In one embodiment, the to-be-decoded data is decoded through a first specified quantity of iterations by using a block matrix including rows 0 to (M−$M_C$−1) and columns 0 to N in the quasi-cyclic LDPC matrix, transposed in the column direction, of the raptor-like structure, to obtain intermediate data of iterative decoding. The intermediate data of iterative decoding is decoded through a second specified quantity of iterations by sequentially using the block matrix including the rows 0 to (M−$M_C$−1) and the columns 0 to N and a block matrix including rows $M_C$ to (M−1) and the columns 0 to N in the quasi-cyclic LDPC matrix, transposed in the column direction, of the raptor-like structure.

In the quasi-cyclic LDPC matrix, transposed in the column direction, of the raptor-like structure, a row weight of a row (H−1) is greater than or equal to a row weight of a row H.

In one embodiment, after decoding the to-be-decoded data each time, if determining that decoding succeeds, the receiving device terminates iterative decoding.

According to a second aspect, a sending device is provided. The sending device has all functions of the sending device for implementing the data transmission method. The functions may be implemented by hardware, or may be implemented by hardware by executing corresponding software. The hardware or the software includes one or more modules corresponding to the foregoing functions. The module may be software and/or hardware.

In one embodiment, the sending device includes an obtaining unit, an encoding unit, a modulation unit, and a sending unit. Functions of the obtaining unit, the encoding unit, the modulation unit, and the sending unit may be corresponding to various operations in the method. Details are not described herein again.

In one embodiment, the sending unit includes a receiver, an encoder, a modulator, and a transmitter. Functions of the receiver, the encoder, the modulator, and the transmitter may be corresponding to various operations in the method. Details are not described herein again.

According to a third aspect, a receiving device is provided. The receiving device has all functions of the receiving device for implementing the data transmission method. The functions may be implemented by hardware, or may be implemented by hardware by executing corresponding software. The hardware or the software includes one or more modules corresponding to the foregoing functions. The module may be software and/or hardware.

In one embodiment, the receiving device includes a receiving unit, a demodulation unit, and a decoding unit. Functions of the receiving unit, the demodulation unit, and the decoding unit may be corresponding to various operations in the method. Details are not described herein again.

In one embodiment, the receiving device includes a receiver, a demodulator, and a decoder. Functions of the receiver, the demodulator, and the decoder may be corresponding to various operations in the method. Details are not described herein again.

According to the data transmission method, the sending device, and the receiving device that are provided in the embodiments, the sending device encodes the information data by using the quasi-cyclic low-density parity-check LDPC code matrix, where in the quasi-cyclic LDPC matrix, the row weight of the row (H−1) is greater than or equal to the row weight of the row H, or the row weight of the row (H−1) is less than or equal to the row weight of the row H. In the decoding process, the receiving device decodes the to-be-decoded data by using the block matrix in the quasi-cyclic LDPC matrix. For example, according to the row weight, a block matrix whose row weight is relatively small is selected preferentially for iterative decoding.

In an iteration process, iterative computation is first performed on a row whose row weight is smaller, and then iterative computation is performed on a row whose row weight is larger. This can increase a convergence speed of iteration. Therefore, in the embodiments of this application, by preferentially selecting, according to a row weight, a block matrix whose row weight is relatively small for iterative decoding, a convergence speed of iteration can be increased and decoding efficiency can be improved. In addition, for a high-code-rate LDPC code part, only when confidence of input information of the high-code-rate LDPC code part reaches higher than a preset threshold of the high-code-rate LDPC code part, a convergence solution may be obtained by performing iterative decoding; otherwise, the iteration process is divergent. Therefore, in the embodiments of this application, a block matrix is used for decoding, and when confidence of the block matrix reaches higher than a preset threshold of the block matrix, bit confidence may be increased, and a computing resource can be saved.

BRIEF DESCRIPTION OF DRAWINGS

FIG. 3 is schematic diagram of a quasi-cyclic LDPC matrix;

FIG. 11A and FIG. 11B are schematic diagrams of two quasi-cyclic LDPC matrices according to an embodiment of this application;

DESCRIPTION OF EMBODIMENTS

The following describes the embodiments of this application with reference to accompanying drawings.

Figure 1:
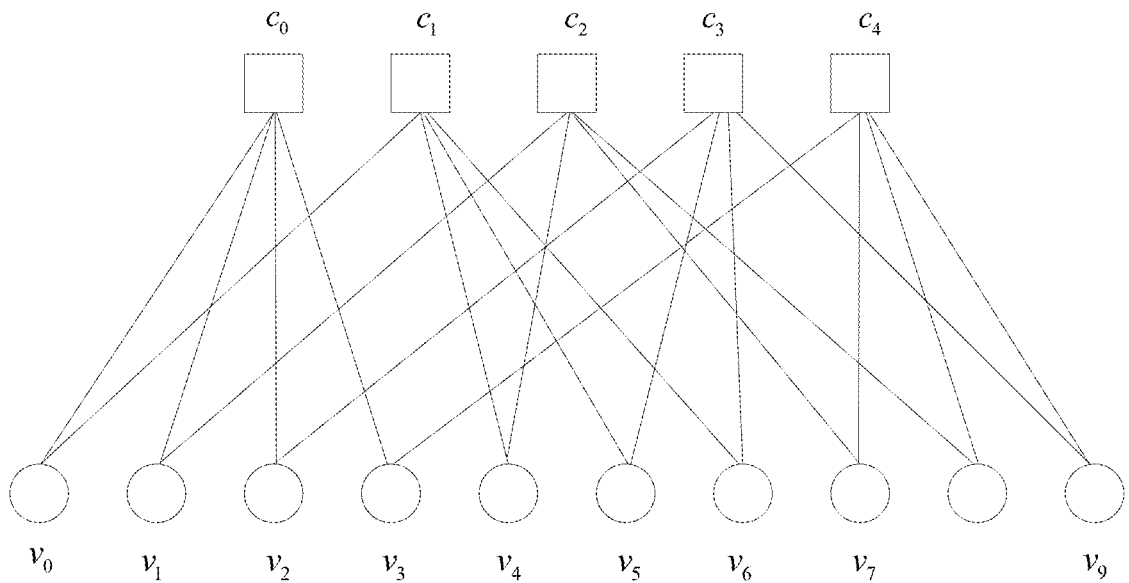
FIG. 1 is a schematic diagram of an LDPC code represented by a Tanner graph.
Figure 2:
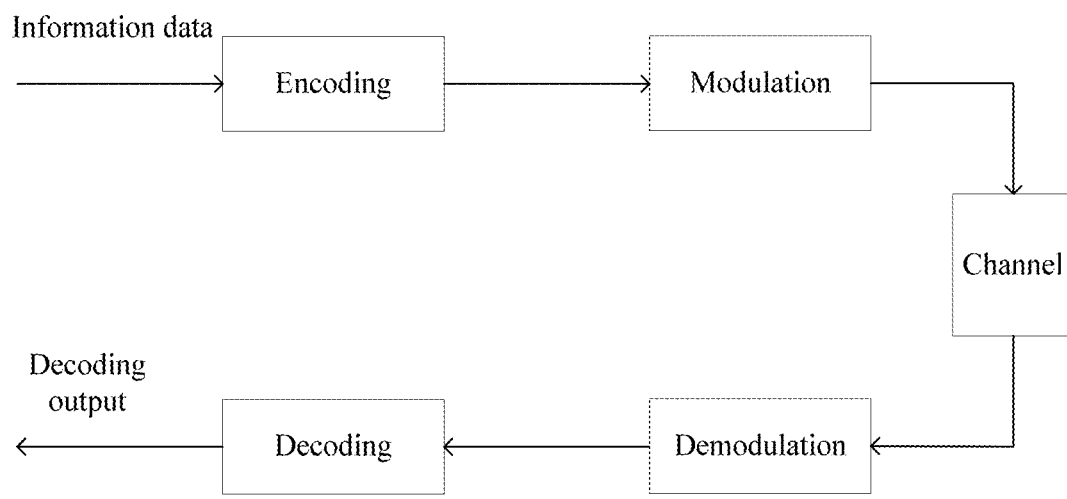
FIG. 2 is a schematic structural diagram of a radio communications system for channel encoding and decoding.

A data transmission method provided in the embodiments of this application may be applied to a radio communications system in which channel encoding and decoding are required. For example, in FIG. 2, a sending device encodes and modulates received information data and sends processed information data through a channel, and after receiving a received signal, a receiving device performs demodulation, decoding, and the like process on the received signal, and outputs information data obtained by decoding.

In the embodiments of this application, the following mainly describes data transmission methods implemented by a sending device and a receiving device. The sending device has functions of encoding, modulating, and sending. The receiving device has functions of receiving, demodulating, and decoding. The data sending device provided in the embodiments of this application may be a device in which an encoder, a modulator, and a transmitter are integrated, and the receiving device may be a device in which a receiver, a demodulator, and a decoder are integrated.

The sending device and the receiving device provided in the embodiments of this application may be any transmit end device and any receive end device that perform data transmission in a wireless manner. The sending device and the receiving device may be any device having wireless sending and receiving functions, including but not limited to a base station NodeB, an evolved NodeB eNodeB, a base station in a fifth generation (the fifth generation, 5G) communications system, a base station or a network device in a future communications system, an access point in a Wi-Fi system, a wireless relay node, a wireless backhaul node, and user equipment (UE). The UE may also be referred to as a terminal terminal, a mobile station (MS), a mobile terminal (MT), and the like. The UE may communicate with one or more core networks through a radio access network (RAN), or may access a distributed network in a self-organization mode or a grant-free mode; the UE may access a wireless network in another mode for communication; or the UE may directly perform wireless communication with another UE. This is not limited in the embodiments of this application.

The data transmission method provided in the embodiments of this application may be applied to downlink data transmission, may be applied to uplink data transmission, and may also be applied to device-to-device (D2D) data transmission. For the downlink data transmission, a sending device is a base station, and a corresponding receiving device is UE. For the uplink data transmission, a sending device is UE, and a corresponding receiving device is a base station. For the D2D data transmission, a sending device is UE, and a corresponding receiving device is also UE. This is not limited in the embodiments of this application.

The sending device and the receiving device in the embodiments of this application may be deployed on land, including indoors or outdoors, and may be held in hands or deployed in vehicles; or may be deployed on water; or may be deployed on an aircraft, a balloon, and a satellite in the air. The UE in the embodiments of this application may be a mobile phone, a tablet computer (Pad), a computer having wireless sending and receiving functions, a virtual reality (VR) terminal device, an augmented reality (AR) terminal device, a wireless terminal in industrial control, a wireless terminal in self driving, a wireless terminal in remote medical, a wireless terminal in a smart grid, a wireless terminal in transportation safety, a wireless terminal in a smart city, a wireless terminal in a smart home, and the like. An application scenario is not limited in the embodiments of this application.

A process in which a receiving device uses a common layered MS method for decoding is described first in the embodiments of this application.

Figure 3:
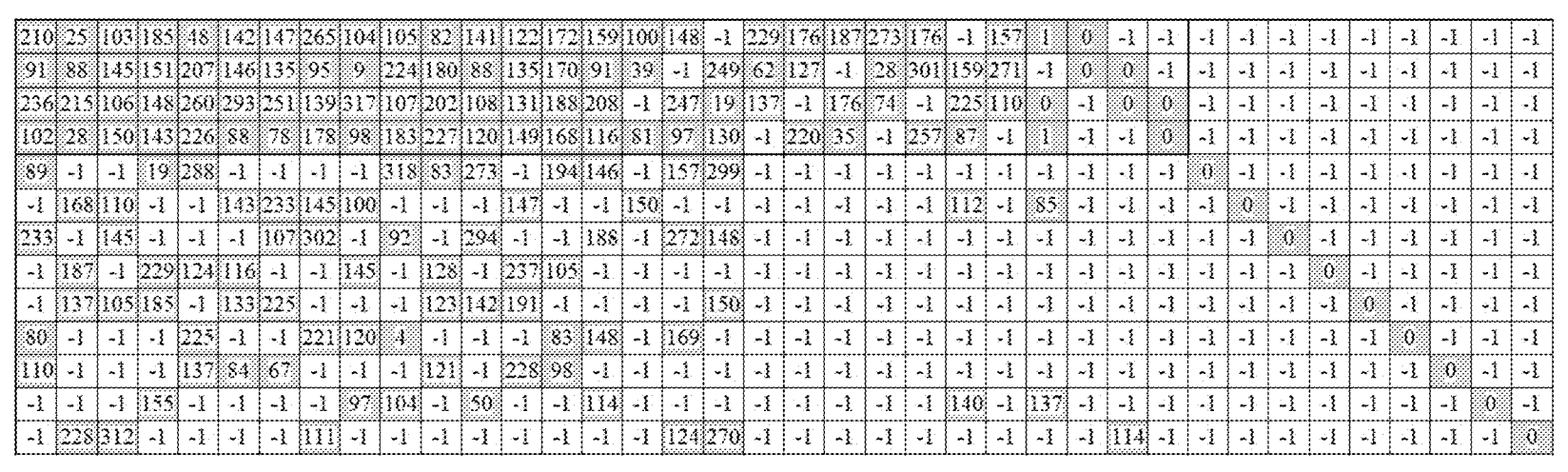

A type of LDPC matrix having a special structured feature is usually used in layered MS decoding. A check matrix H of the LDPC matrix is a (m*z)*(n*z) matrix that includes a quantity of m*n block matrices. Each block is obtained through a cyclic shift of a z*z identity matrix. The LDPC matrix having the special structured feature may be referred to as a quasi-cyclic (QC) LDPC matrix. An LDPC matrix below in the embodiments of this application is also a quasi-cyclic LDPC matrix. FIG. 3 is a quasi-cyclic LDPC matrix. In FIG. 3, each element in the quasi-cyclic LDPC matrix represents a matrix. A matrix represented by elements whose values are all −1 is expanded to obtain a z*z all-zero matrix. The expansion of an element whose value is −1 may be expressed as:

$$-1 \to \begin{bmatrix} 0 & 0 & 0 & 0 \\ 0 & 0 & 0 & 0 \\ 0 & 0 & 0 & 0 \\ 0 & 0 & 0 & 0 \end{bmatrix},$$

and in an actual matrix, −1 may also be represented by a space, a letter, a mathematical symbol, or another symbol.

A matrix represented by other elements different from the element whose value is −1 is expanded to obtain a z*z permutation matrix. The permutation matrix may be obtained through a corresponding quantity of cyclic shifts of an identity matrix I, and the quantity of shifts is equal to a value of a corresponding matrix element. For example, if a matrix expansion factor z=4 and the expansion factor represents a size of an expanded matrix (an element value in the quasi-cyclic LDPC matrix), an element expansion process may be expressed as:

$$0 \rightarrow \begin{bmatrix} 1 & 0 & 0 & 0 \\ 0 & 1 & 0 & 0 \\ 0 & 0 & 1 & 0 \\ 0 & 0 & 0 & 1 \end{bmatrix}, 1 \rightarrow \begin{bmatrix} 0 & 1 & 0 & 0 \\ 0 & 0 & 1 & 0 \\ 0 & 0 & 0 & 1 \\ 1 & 0 & 0 & 0 \end{bmatrix}, 2 \rightarrow \begin{bmatrix} 0 & 0 & 1 & 0 \\ 0 & 0 & 0 & 1 \\ 1 & 0 & 0 & 0 \\ 0 & 1 & 0 & 0 \end{bmatrix},$$

$$3 \rightarrow \begin{bmatrix} 0 & 0 & 0 & 1 \\ 1 & 0 & 0 & 0 \\ 0 & 1 & 0 & 0 \\ 0 & 0 & 1 & 0 \end{bmatrix}.$$

In one embodiment, when the element value in the quasi-cyclic LDPC matrix is greater than a preset expansion factor, the element needs to be divided and to be rounded down, and then a cyclic shift is performed. A formula is as follows:

$$p(f, i, j) = \begin{cases} p(i, j), & p(i, j) \leq 0 \\ p(i, j) \bmod z_f, & p(i, j) > 0 \end{cases}.$$

In the formula, $z_f$ represents an actual expansion factor, and p(i,j) represents a corresponding element value in the quasi-cyclic LDPC matrix. When $p(i,j) > z_f$, after a new cyclic shift value p(f,i,j) is obtained through computation according to the foregoing formula, the element needs to be expanded and a cyclic shift is performed on an expanded element.

In one embodiment, main symbols related to a layered MS decoding process are defined as follows:

it represents a current quantity of iterations, it=1, 2, L, Max_Iter, and Max_Iter represents a maximum quantity of iterations;

l represents a current quantity of to-be-updated layers, l=0, 1, L, L−1, and L represents a quantity of layers in a check matrix;

i represents a row i in the check matrix, i=0, 1, L, M−1, and M represents a quantity of rows in the check matrix;

j represents a column j in the check matrix, j=0, 1, L, N−1, and N represents a quantity of columns in the check matrix;

$\lambda_j$ represents log likelihood ratio (likelihood Rate, LLR) information of a $j^{th}$ element in an input sequence;

$R_{ij}[it]$ represents information transmitted from an $i^{th}$ check node to a $j^{th}$ variable node, when the $it^{th}$ iteration is performed;

$Q_{ij}[it]$ represents information transmitted from the $j^{th}$ variable node to the $i^{th}$ check node when the $it^{th}$ iteration is performed;

$Q_j[it]$ represents posterior probability information, used for a hard decision, of the $j^{th}$ variable node when the $it^{th}$ iteration is performed;

C(j) represents a set of check nodes connected to the $j^{th}$ variable node; and V(i) represents a set of variable nodes connected to the $i^{th}$ check node.

During layered MS decoding, the quasi-cyclic LDPC matrix is divided by row into a plurality of layers from top to bottom, and the plurality of layers are updated according to an order. After rows in each layer are updated, all columns connected to the rows in the layer are updated immediately, and then, rows in a next layer are updated. Rows and columns are alternately updated in the layered MS decoding process. After rows in a current layer are updated, columns in the current layer are first updated, and then rows in a next layer are updated. In this case, the rows in the next layer are updated according to information about other newly-updated rows, so that a convergence speed of iteration is relatively high. The layered MS decoding process mainly includes the following operations.

Operation 1: Perform initialization.

In the decoding process, an input sequence (to-be-decoded data) is generally LLR data, and the LLR data may be defined as:

$$\lambda_j = LLR_j = \ln \frac{p(0)}{p(1)},$$

that is, a negative logic mapping (0→+1, 1→−1). Certainly, the LLR data may alternatively be a positive logic mapping (0→−1, 1→+1), that is, $$\lambda_j = LLR_j = \ln \frac{p(1)}{p(0)}. \quad j = 0, 1, L, N-1,$$

and N represents a quantity of columns in the check matrix.

For i=0, 1, L, M−1, M represents a quantity of rows in the check matrix, and information $R_{ij}[0]$ transmitted from the $i^{th}$ check node to the $j^{th}$ variable node is initialized to 0, where j∈V(i).

For j=0, 1, L, N−1, posterior probability information $Q_j[0]$ of the $j^{th}$ variable node is initialized to $\lambda_j$.

A quantity of iterations it=1, and a quantity of to-be-updated layers l=0.

Operation 2: Perform iterative computation.

Figure 4:
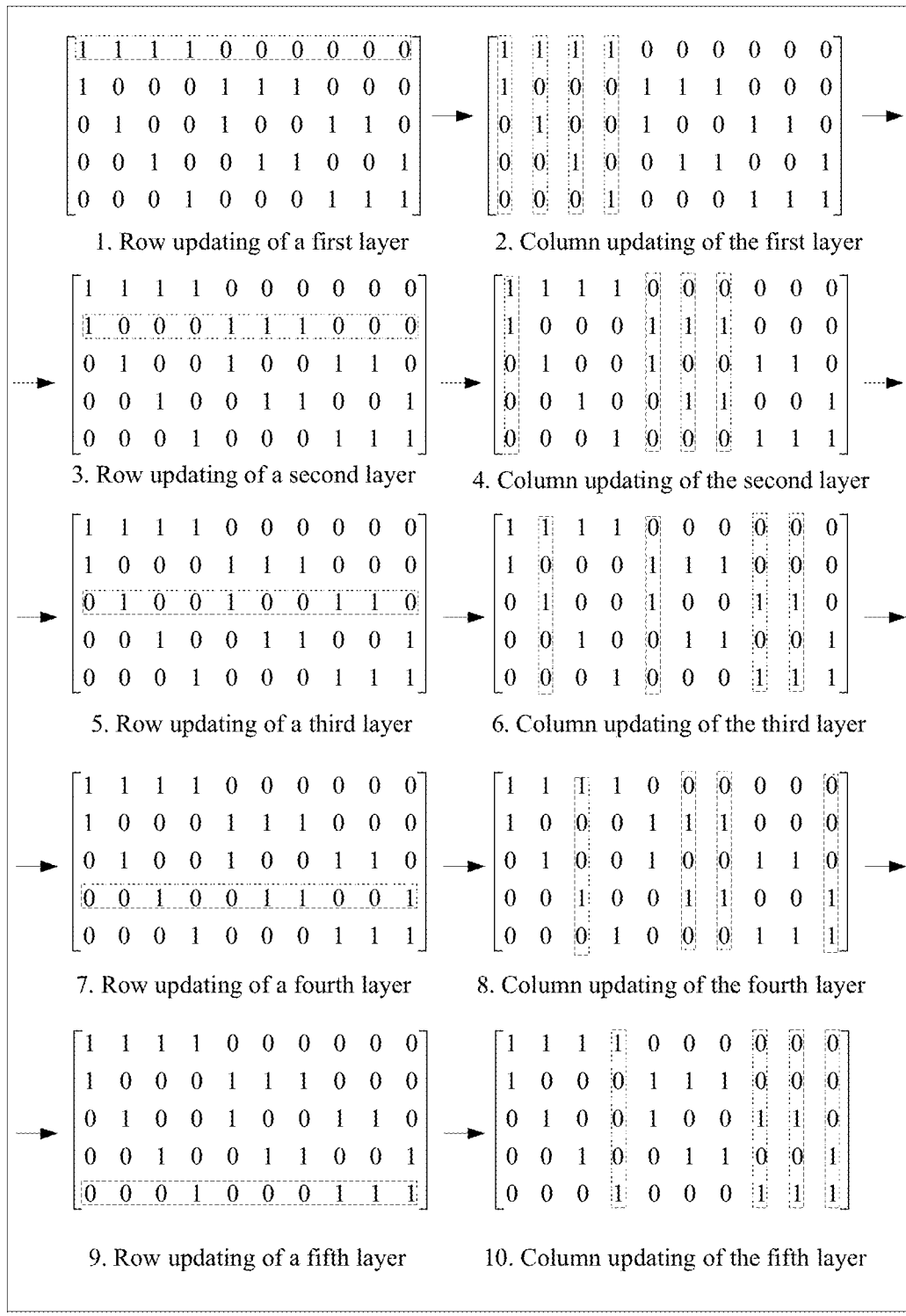
FIG. 4 is a flowchart of node updating in layered decoding of an LDPC code.

In the decoding process, an alternate computation for updating is performed between check nodes (row) and variable nodes (column) until decoding succeeds or a maximum quantity of iterations is reached. In a layered MS algorithm, parallel computation may be performed on all check nodes (row) in one layer, and after all rows in the layer are updated, columns in which all non-zero elements in the rows are located are updated. FIG. 4 is a flowchart of node updating in layered decoding of an LDPC code. Herein, each layer only has one row.

A non-zero element obtained after the quasi-cyclic LDPC matrix is expanded is equivalent to a non-negative element in a basis matrix. These are not distinguished in the following.

In each iteration, a decoder of a receiving device needs to complete updating of check nodes (row) in all layers and variable nodes (column) connected to the check nodes in the quasi-cyclic LDPC matrix.

Specifically, assuming that a current quantity of iterations is it(1≤it≤Max_Iter), an updating process of an $l(0≤l≤L-1)_{th}$ layer is as follows.

(1) Input Information Computation for Check Nodes

To update check nodes in the $l^{th}$ layer, information transmitted from a $j^{th}$ variable node (Variable Node, VN), connected to the check nodes (Check Node, CN) in this layer, to an $i^{th}$ to check node CN needs to be first computed. Herein, $lz \le i \le (l+1)z-1$, where z is an expansion factor, and $j \in V(i)$, and $Q_{ji}[it] = Q_j[it] - R_{ij}[it-1]$.

Because $Q_j$ [it] is updated for a quantity of times in one iteration, and for ease of description, in this embodiment of this application, $Q_j[it]$ is always a latest updating result. When $l=0$, $Q_j[it] = Q_j[it-1]$.

(2) Check Node Updating

For the $i^{th}$ check node, a minimum value $\min_i[it]$ of information absolute values $|Q_{ji}[it]|$ of variable nodes connected to the $i^{th}$ check node and a column sequence $\min\_index_i[it]$ corresponding to the minimum value are first computed, where $$\min_i [it] = \min_{j' \in V(i)} (|Q_{j'i}[it]|) = |Q_{mi}[it]|, \min\_index_i[it] = m.$$

Then, among other values different from the minimum value, minimum-value computing is performed to obtain a subminimum value $\text{submin}_i[it]$, where $$\text{submin}_i [it] = \min_{j' \in V(i) \setminus m} (|Q_{j'i}[it]|).$$

Then, a product of symbols of all the variable nodes connected to the $i^{th}$ check node are computed:

$$\text{sgn\_all}_i[it] = \prod_{j' \in V(i)} \text{sgn}(Q_{j'i}[it]).$$

Finally, check node updating is completed according to the foregoing information:

$$Temp = \begin{cases} \max[(\alpha \cdot \min[it]), 0], & \text{if } j \neq \min\_index_i[it] \\ \max[(\alpha \cdot \text{submin}[it]), 0], & \text{if } j = \min\_index_i[it] \end{cases}, \text{ and}$$

$$R_{ij}[it] = \text{sgn\_all}_i[it] \cdot \text{sgn}(Q_{ji}[it]) \cdot Temp.$$

In the formula, $\alpha$ is a normalization correction factor, and $\alpha$ is preset by a system.

(3) Variable-Node Updating

During computation of variable-node information, assuming that the check node completes updating of the $l^{th}$ layer in the $it^{th}$ ($1 \le it \le Max\_Iter$) iteration in this case, only the variable node j connected to the check node i in the $l^{th}$ layer needs to be updated. Herein $lz \le i \le (l+1)z-1$, and $j \in V(i)$.

After iterative decoding is completed each time, posterior probability information of the variable node needs to be computed, to perform hard decision detection. Posterior probability information of the $j^{th}$ variable node may be computed by using the following formula: $Q_j[it] = Q_j[it] + (R_{ij}[it] - R_{ij}[it-1])$. The hard decision detection may be completed according to a posterior probability. A hard decision process is as follows:

According to a formula $$HDD_j = \begin{cases} 0, & Q_j > 0 \\ 1, & Q_j \le 0 \end{cases},$$

after a hard decision sequence $HDD = (HDD_0, HDD_1, L, HDD_{K-1}, L, HDD_{N-1})$ whose length is N is obtained, quasi-cyclic LDPC matrix decoding check is performed on the sequence. If $H \cdot HDD^T = 0$, a decoding result satisfies all check equations, and quasi-cyclic LDPC matrix decoding succeeds. If $H \cdot HDD^T \ne 0$, the quasi-cyclic LDPC matrix check fails, and the iteration continues to be performed until correct decoding is performed or a maximum quantity of iterations is reached.

It can be understood that because only one check node in each layer is connected to the $j^{th}$ variable node, for each constant j, there is one value i and only one value i corresponding to j.

A check node updating formula is $R_{ij}[it] = \text{sgn\_all}_i[it] \cdot \text{sgn}(Q_{ji}[it]) \cdot Temp$, and may be expressed as $$R_{ij}[k] = \alpha \cdot \prod_{j' \in V(i) \setminus j} \text{sgn}(Q_{j'i}[k]) \cdot \min_{j' \in V(i) \setminus m} (|Q_{j'i}[k]|). \quad V(i) \setminus \{j\}$$

represents a quantity of variable nodes connected to a current check node. It can be learned from the formula that, fewer elements in $V(i) \setminus \{j\}$ indicate a larger value of transmitted information value $R_{ij}[k]$. It can be qualitatively explained that a smaller row weight of a current updated check node indicates a larger update value transmitted to each variable node. Therefore, in an iteration process, iterative computation is first performed on a row whose row weight is smaller, and then iterative computation is performed on a row whose row weight is larger. This can increase a convergence speed of iteration. The row weight may be understood as a quantity of target elements in each row in the quasi-cyclic LDPC matrix. A non-zero matrix is obtained after a matrix represented by the target elements is expanded. For example, it may be considered that a quantity of non-zero elements in a row of an expanded quasi-cyclic LDPC matrix is a quantity of non-negative elements in an LDPC basis matrix. For ease of description, description is provided below in this embodiment of this application by using a representation in which a row weight represents a quantity of non-zero elements.

In one embodiment, to increase a convergence speed of iteration in a decoding process, a sending device may encode information data by using a quasi-cyclic LDPC matrix in which a row weight of a row (H−1) is greater than or equal to a row weight of a row H or a row weight of a row (H−1) is less than or equal to a row weight of a row H. H is an integer and $0 \le H \le M-1$, and M represents a quantity of rows in the quasi-cyclic LDPC matrix. In the decoding process, according to a row weight order, a receiving device preferentially selects a block matrix whose row weight is relatively small for iterative decoding.

Figure 5:
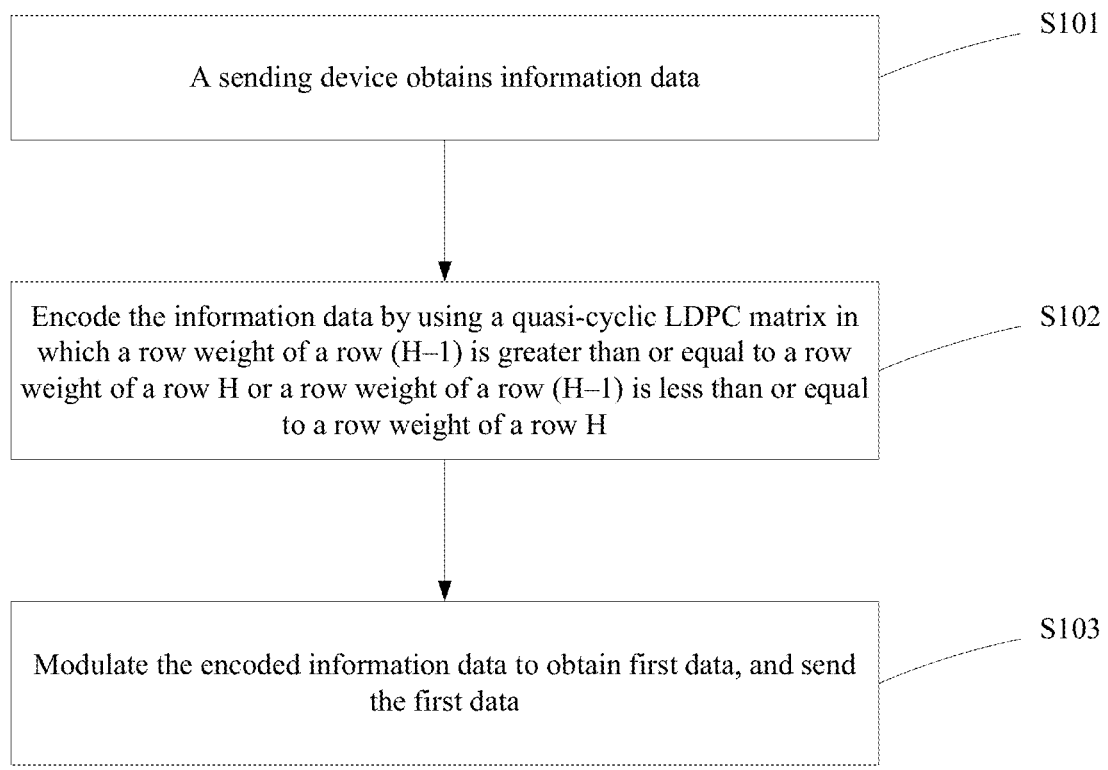
FIG. 5 is a schematic diagram of a data transmission method according to an embodiment of this application.

FIG. 5 is a schematic diagram of a data transmission method according to an embodiment of this application. The data transmission method shown in FIG. 5 may be applied to a sending device. Referring to FIG. 5, the data transmission method includes the following operations:

Operation S101: The sending device obtains information data.

Operation S102: The sending device encodes the information data by using a quasi-cyclic LDPC matrix, where in the quasi-cyclic LDPC matrix, a row weight of a row (H−1) is greater than or equal to a row weight of a row H, or a row weight of a row (H−1) is less than or equal to a row weight of a row H, where H is an integer and $0 \leq H \leq M-1$, and M represents a quantity of rows in the quasi-cyclic LDPC matrix.

Operation S103: The sending device modulates the encoded information data to obtain first data, and sends the first data.

In one embodiment, the row weight in the quasi-cyclic LDPC matrix may increase row by row or decrease row by row. In a specific implementation, there may alternatively two rows whose row weights are equal to each other or in descending order, but overall row weights of the quasi-cyclic LDPC matrix are increasing or decreasing.

In one embodiment, the quasi-cyclic LDPC matrix in which the row weight of the row (H−1) is less than or equal to the row weight of the row H may be a quasi-cyclic LDPC matrix of a raptor-like structure. The quasi-cyclic LDPC matrix in which the row weight of the row (H−1) is greater than or equal to the row weight of the row H may be a quasi-cyclic LDPC matrix, transposed in a column direction, of a raptor-like structure.

Figure 6:
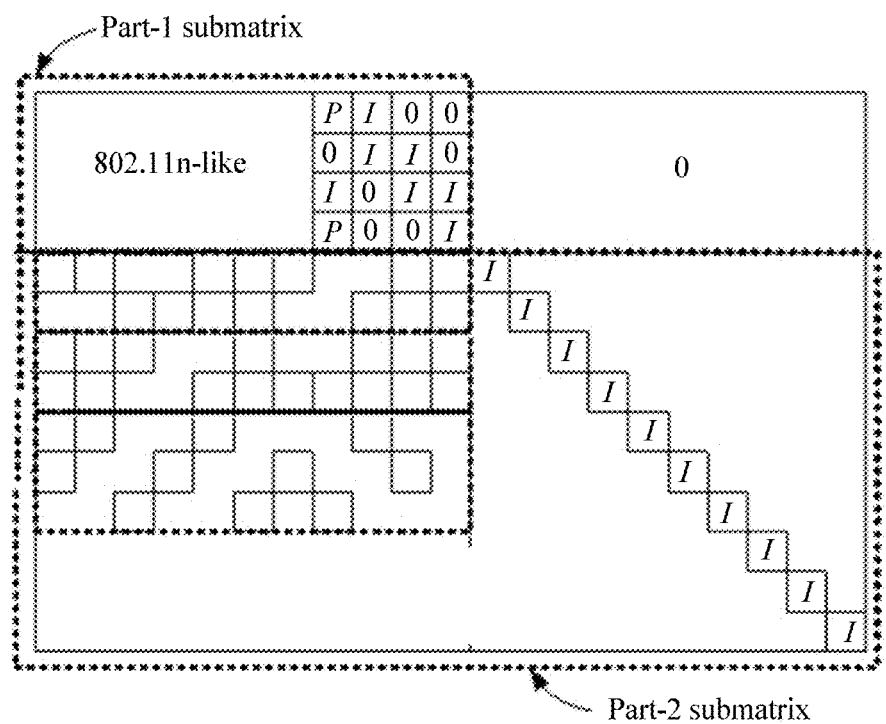
FIG. 6 is a schematic structural diagram of a quasi-cyclic LDPC matrix of a raptor-like structure.

FIG. 6 is a schematic structural diagram of a quasi-cyclic LDPC matrix of a raptor-like structure. Referring to FIG. 6, the LDPC matrix of the raptor-like structure includes two submatrices: a part-1 submatrix and a part-2 submatrix. The part-1 sub-matrix is a high-code-rate quasi-cyclic LDPC matrix. Generally, a column in which a non-negative element in any row of the part-1 submatrix is located includes at least two non-negative elements. The part-1 sub-matrix may act as a high-code-rate LDPC code to independently perform encoding and decoding, or may be referred to as an 802.11n-like matrix and a core matrix. Generally, the core matrix may also be understood as a matrix whose check part includes a double-diagonal structure or a lower triangular structure. For ease of description, in this embodiment of this application, the part-1 submatrix is referred to as a core matrix. The part-2 submatrix may be divided into a left part and a right part. A width of the left-part matrix is equal to a width of a core matrix. The right part is an identity matrix, and column weights of all columns in the right-part matrix are all 1 (the column weight represents a quantity of non-zero elements in one column of an expanded matrix). The part-2 submatrix needs to be combined with the part-1 submatrix to form a complete LDPC code, and the complete LDPC code is also referred to as an expanded matrix. For ease of description, in this embodiment of this application, the part-2 submatrix is referred to as a core matrix.

Figure 7:
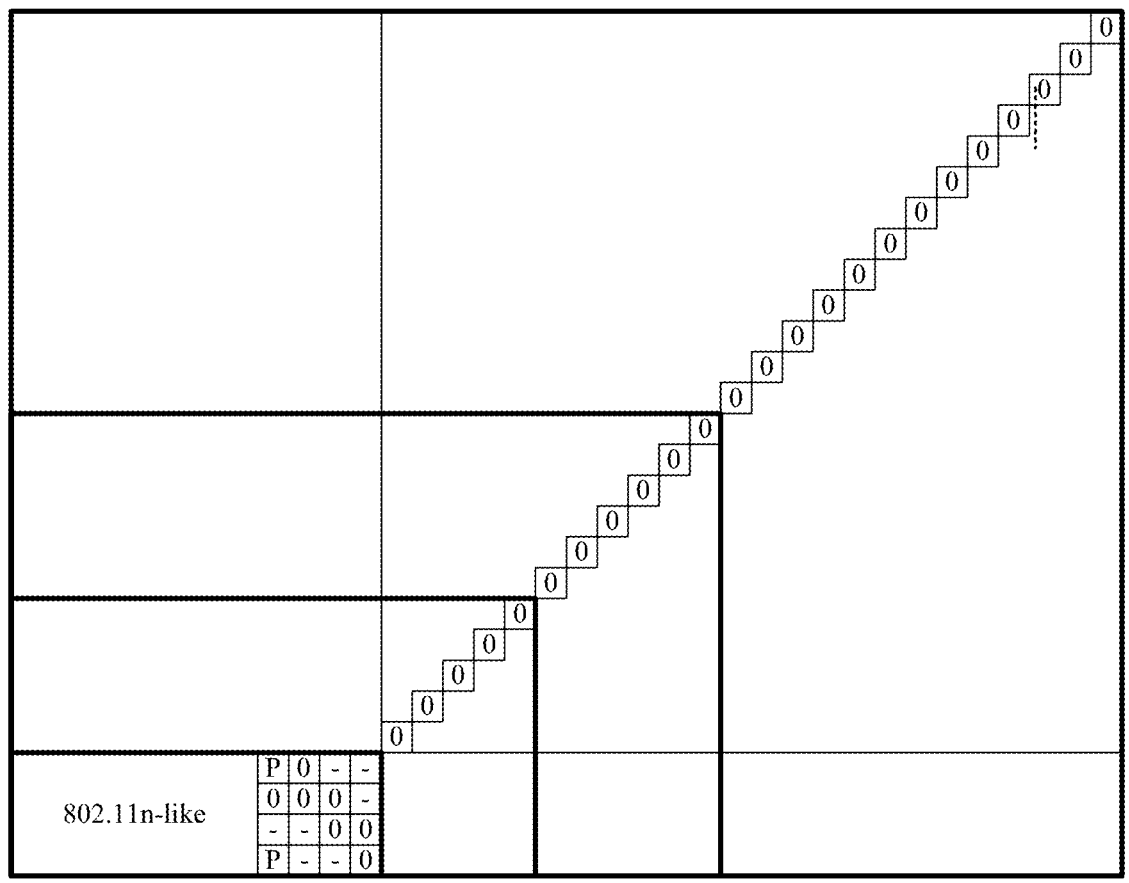
FIG. 7 is a schematic structural diagram of a quasi-cyclic LDPC matrix, transposed in a column direction, of a raptor-like structure.

FIG. 7 is a schematic structural diagram of a quasi-cyclic LDPC matrix, transposed in a column direction, of a raptor-like structure. Referring to FIG. 7, in the quasi-cyclic LDPC matrix, transposed in the column direction, of the raptor-like structure, a core matrix is located at a lower left corner, an all-zero matrix is located at a lower right corner, an expanded matrix is located at an upper left corner, and an identity matrix obtained after mirror image reversal is located at an upper right corner.

A sending device encodes information data by using a quasi-cyclic LDPC matrix in which a row weight of a row (H−1) is greater than or equal to a row weight of a row H or a row weight of a row (H−1) is less than or equal to a row weight of a row H, modulates the encoded information data to obtain first data, and sends the first data to a receiving device. The receiving device may obtain to-be-decoded data after demodulating obtained second data, and decodes the to-be-decoded data by using the quasi-cyclic LDPC matrix.

Figure 8:
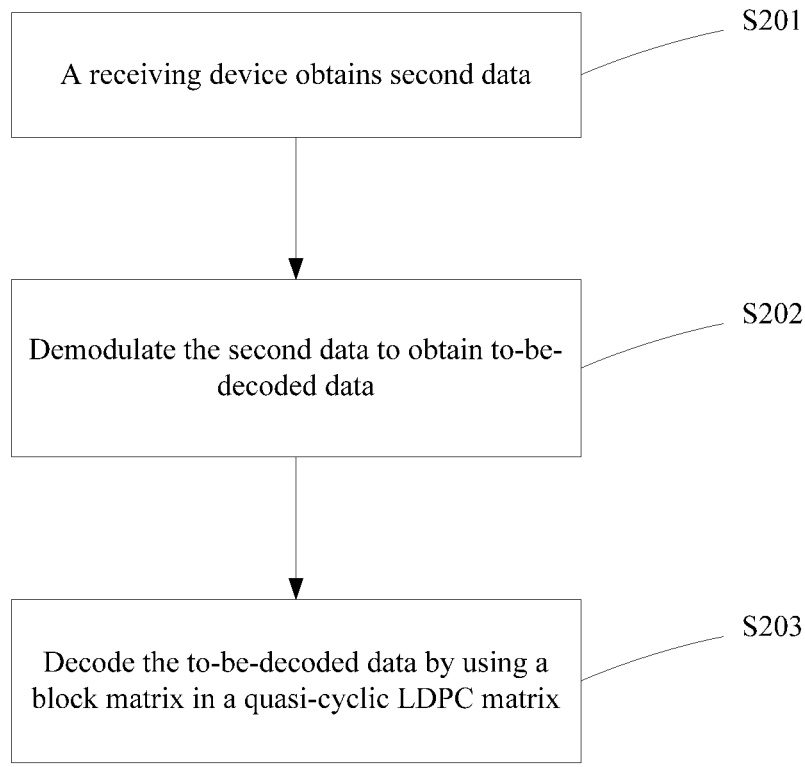
FIG. 8 is a schematic diagram of another data transmission method according to an embodiment of this application.

FIG. 8 is a schematic diagram of another data transmission method according to an embodiment of this application. The data transmission method shown in FIG. 8 may be applied to a receiving device. Referring to FIG. 8, the data transmission method includes the following operations:

Operation S201: The receiving device obtains second data.

The second data in this embodiment of this application may be understood as first data sent by a sending device and transmitted to the receiving device through a channel.

Operation S202: The receiving device demodulates the second data to obtain to-be-decoded data.

Operation S203: The receiving device decodes the to-be-decoded data by using a block matrix in a quasi-cyclic LDPC matrix.

In one embodiment, the block matrix is a submatrix in the quasi-cyclic LDPC matrix. For example, the block matrix may be a core matrix and an expanded matrix in a quasi-cyclic LDPC matrix of a raptor-like structure.

In one embodiment, the quasi-cyclic LDPC matrix is a quasi-cyclic LDPC matrix of a raptor-like structure, which is used as an example to describe a process in which the receiving device decodes the to-be-decoded data by using the block matrix.

A raptor-like matrix structure may be considered as cascading of a high-code-rate LDPC code (core matrix) and a low-code-rate Luby transform code (LT). For a high-code-rate LDPC code part, only when confidence of input information of the high-code-rate LDPC code part reaches higher than a preset threshold of the high-code-rate LDPC code part, a convergence solution may be obtained by performing iterative decoding; otherwise, an iteration process is divergent. For each bit, bit confidence may not increase as a quantity of iterations increases. However, for the LT code cascaded with the high-code-rate LDPC code, check equations between rows are relatively independent, and convergence is also unidirectional. Therefore, each iteration can improve bit confidence. Therefore, when a conventional decoding method is used for decoding the quasi-cyclic LDPC matrix of the raptor-like structure, an initial quantity of iterative computations cannot increase the bit confidence, wasting a computing resource. In one embodiment, during iterative decoding, the receiving device may perform iterative decoding on the to-be-decoded data by first using the LT code matrix cascaded with the core matrix, to increase bit confidence, thereby saving a computing resource.

In one embodiment, assuming that the quasi-cyclic LDPC matrix of the raptor-like structure is a matrix of M rows×N columns, a core matrix in the quasi-cyclic LDPC matrix of the raptor-like structure is $M_C$ rows×$N_C$ columns. $M_C < M$, and M, N, $M_C$, and $N_C$ are all positive integers. In the quasi-cyclic LDPC matrix of the raptor-like structure, a block matrix including rows 0 to ($M_C-1$) and columns 0 to ($N_C-1$) is a core matrix and a block matrix including rows $M_C$ to (M−1) and the columns 0 to ($N_C-1$) is an expanded matrix.

Figure 9:
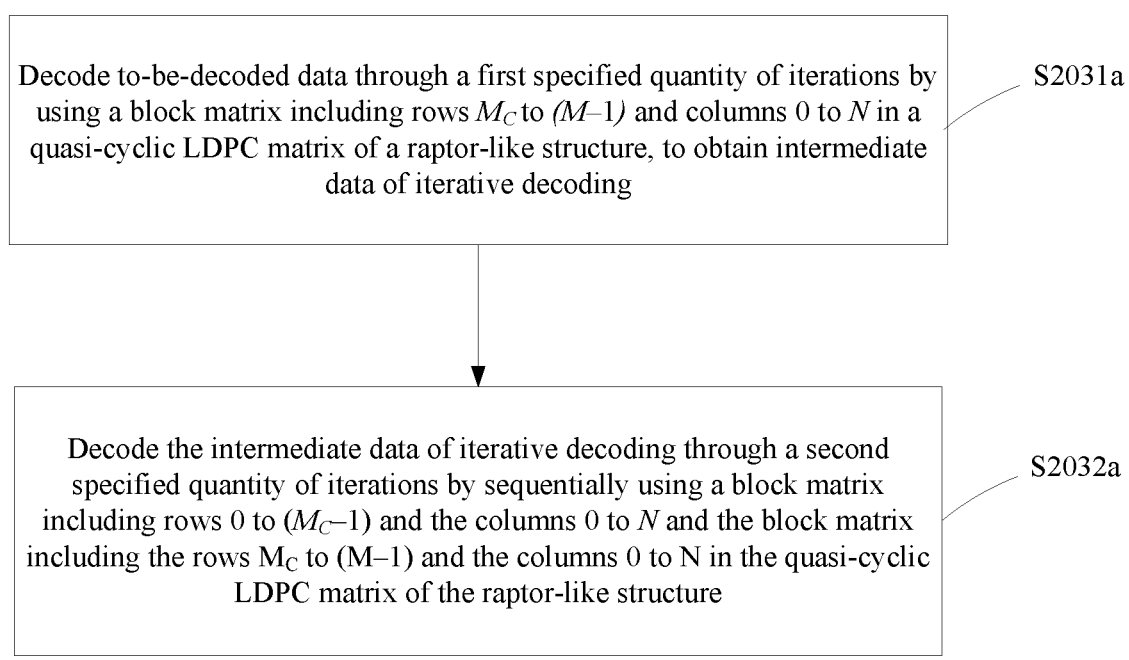
FIG. 9 is a schematic flowchart of decoding to-be-decoded data by using a block matrix according to an embodiment of this application.

The receiving device may use a process shown in FIG. 9 to decode the to-be-decoded data by using the block matrix.

Operation S2031a: Decode the to-be-decoded data through a first specified quantity of iterations by using a block matrix including rows $M_C$ to (M−1) and columns 0 to N in the quasi-cyclic LDPC matrix of the raptor-like structure, to obtain intermediate data of iterative decoding.

In one embodiment, assuming that input $\lambda_j$=LLR_in$_j$ is defined as ln $$\frac{p(0)}{p(1)},$$

that is, a negative logic mapping (0→+1, 1→−1). When j∈[0,l$_0$), input $\lambda_j$ is corresponding to a bit of information data; when j∈[l$_0$,l$_1$), input $\lambda_j$ represents a check bit corresponding to a core matrix; and when j∈[l$_1$,n) and n represents a code length, input $\lambda_j$ represents a check bit corresponding to an expanded matrix. The first specified quantity of iterations is preset to iter$_{pre}$, and a second specified quantity of iterations is preset to iter$_{full}$.

First, an initialization process related to the foregoing embodiment is used to initialize information about check nodes and variable nodes in a part in which i=M$_C$, M$_C$+1, . . . , (M−1) and j=0, 1, L, N−1. Information R$_{ij}$[0] transmitted from an i$^{th}$ check node to a j$^{th}$ variable node is initialized to 0, where j∈V(i). Information R$_{ij}$[0] transmitted from the j$^{th}$ variable node to the i$^{th}$ check node is initialized to $\lambda_j$, where i∈C(j).

Then, the to-be-decoded data is decoded through the first specified quantity iter$^{pre}$ of iterations in the check node updating manner and the variable node updating manner in the foregoing embodiment by using the block matrix including the rows M$_C$ to (M−1) and the columns 0 to N in the quasi-cyclic LDPC matrix of the raptor-like structure. When a quantity of iterations reaches the quantity iter$_{pre}$ of iterations, decoding is completed through the first specified quantity iter$_{pre}$ of iterations, to obtain immediate data of iterative decoding.

Operation S2032a: Decode the intermediate data of iterative decoding through a second specified quantity of iterations by sequentially using a block matrix including rows 0 to (M$_C$−1) and columns 0 to N and the block matrix including the rows M$_C$ to (M−1) and the columns 0 to N in the quasi-cyclic LDPC matrix of the raptor-like structure.

In one embodiment, after decoding is completed through the first specified quantity iter$_{pre}$ of iterations, to obtain the immediate data of iterative decoding, decoding may be performed through the second specified quantity of iterations by using the whole quasi-cyclic LDPC matrix, including the core matrix, of the raptor-like structure.

First, before decoding is performed through the second specified quantity of iterations, a check node and a variable node in the core matrix part still need to be initialized first. In this embodiment of this application, information about check nodes and variable nodes in a part in which i=M$_C$, M$_C$+1, . . . , (M−1) and j=0, 1, L, N−1 is initialized. Information R$_{ij}$[iter$_{pre}$] transmitted from an check node to a j$^{th}$ variable node is initialized to 0, and information Q$_{ji}$[iter$_{pre}$] transmitted from the j$^{th}$ variable node to the i$^{th}$ check node is initialized according to a formula $$Q_{ji}[iter_{pre}] = \lambda_j + \sum_{i' \in C(j) \setminus [i]} R_{i'j}[iter_{pre}], i \in [0, m_1 - 1] \cdot i \in C(j),$$

$$i \in [0, M_C - 1].$$

Then, the intermediate data of iterative decoding is decoded through the second specified quantity iter$_{full}$ of iterations in the check node updating manner and the variable node updating manner in the foregoing embodiment by sequentially using the block matrix including the rows 0 to (M$_C$−1) and the columns 0 to N and the block matrix including the rows M$_C$ to (M−1) and the columns 0 to N in the quasi-cyclic LDPC matrix of the raptor-like structure. When a quantity of iterations reaches iter$_{full}$, decoding is completed through the second specified quantity iter$_{full}$ of iterations.

In one embodiment, after decoding is performed on the to-be-decoded data each time by using the block matrix in the quasi-cyclic LDPC matrix, posterior probability information of the variable nodes needs to be computed, to perform hard decision detection. If the decision indicates that decoding succeeds, iterative decoding is terminated and a current hard decision code word is output.

In one embodiment, if the quantity iter$_{full}$ of iterations is reached and decoding has not succeeded, the decoding fails, and is terminated.

In one embodiment, the quasi-cyclic LDPC matrix of the raptor-like structure used for decoding the to-be-decoded data may be a quasi-cyclic LDPC matrix in which a row weight of a row (H−1) is less than or equal to a row weight of a row H.

In another embodiment, in the quasi-cyclic LDPC matrix, a row weight of a row (H−1) is greater than or equal to a row weight of a row H. The quasi-cyclic LDPC matrix may be a quasi-cyclic LDPC matrix, transposed in a column direction, of a raptor-like structure.

Assuming that the quasi-cyclic LDPC matrix, transposed in the column direction, of the raptor-like structure is a matrix of M rows×N columns, a core matrix in the quasi-cyclic LDPC matrix, transposed in the column direction, of the raptor-like structure is M$_C$ rows×N$_C$ columns. M$_C$<M, and M, N, M$_C$, and N$_C$ are all positive integers. In the quasi-cyclic LDPC matrix, transposed in the column direction, of the raptor-like structure, a block matrix including rows M$_C$ to (M−1) and columns 0 to (N$_C$−1) is a core matrix and a block matrix including rows 0 to (M−M$_C$−1) and columns 0 to (N$_C$−1) is an expanded matrix.

Figure 10:
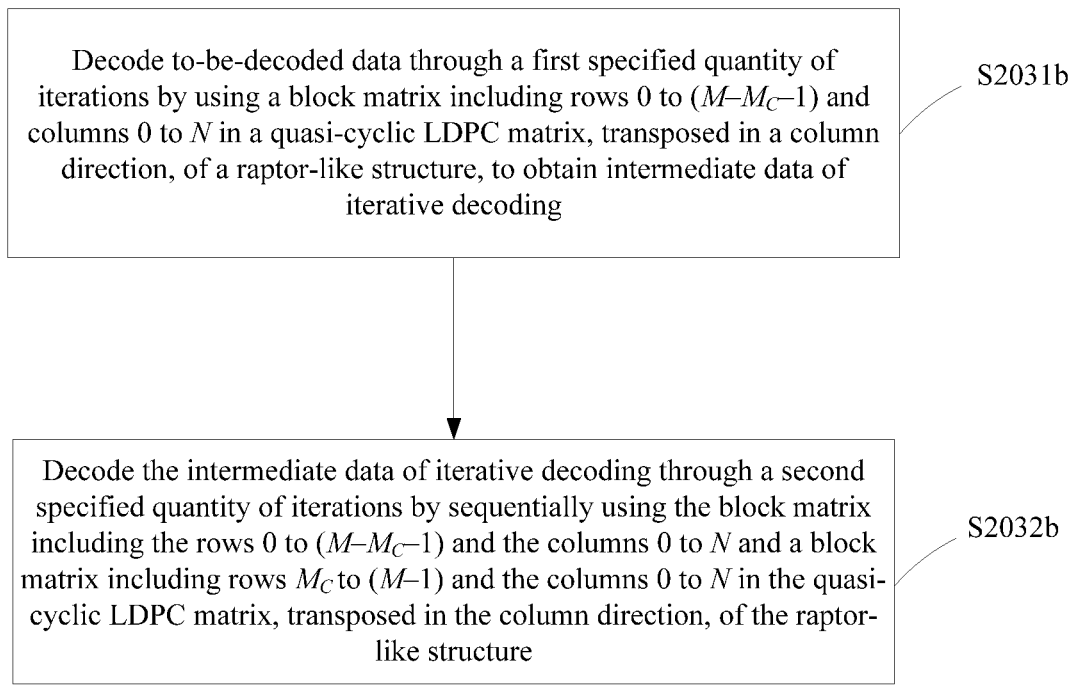
FIG. 10 is another schematic flowchart of decoding to-be-decoded data by using a block matrix according to an embodiment of this application.

The receiving device may use a process shown in FIG. 10 to decode the to-be-decoded data by using the block matrix.

Operation S2031b: Decode the to-be-decoded data through a first specified quantity of iterations by using a block matrix including rows 0 to (M−M$_C$−1) and columns 0 to N in the quasi-cyclic LDPC matrix, transposed in the column direction, of the raptor-like structure, to obtain intermediate data of iterative decoding.

Operation S2032b: Decode the intermediate data of the iterative decoding through a second specified quantity of iterations by sequentially using the block matrix including the rows 0 to (M−M$_C$−1) and the columns 0 to N and a block matrix including rows M$_C$ to (M−1) and the columns 0 to N in the quasi-cyclic LDPC matrix, transposed in the column direction, of the raptor-like structure.

For specific decoding implementations in S2031b and S2032b, refer to implementation processes of S2031a and S2032a. Detailed are not repeated herein.

In one embodiment, during iterative decoding, the receiving device performs iterative decoding on the to-be-decoded data by first using the LT code matrix cascaded with the core matrix, to increase bit confidence, thereby saving a computing resource.

In one embodiment, during iterative decoding performed by using the quasi-cyclic LDPC matrix, transposed in the column direction, of the raptor-like structure, decoding may also be performed by using a common layered MS decoding method. In this case, because overall row weights in this matrix increase row by row, a convergence speed of the quasi-cyclic LDPC matrix, transposed in the column direction, of the raptor-like structure is higher than that of a conventional quasi-cyclic LDPC matrix of a raptor-like structure.

Figure 11A:
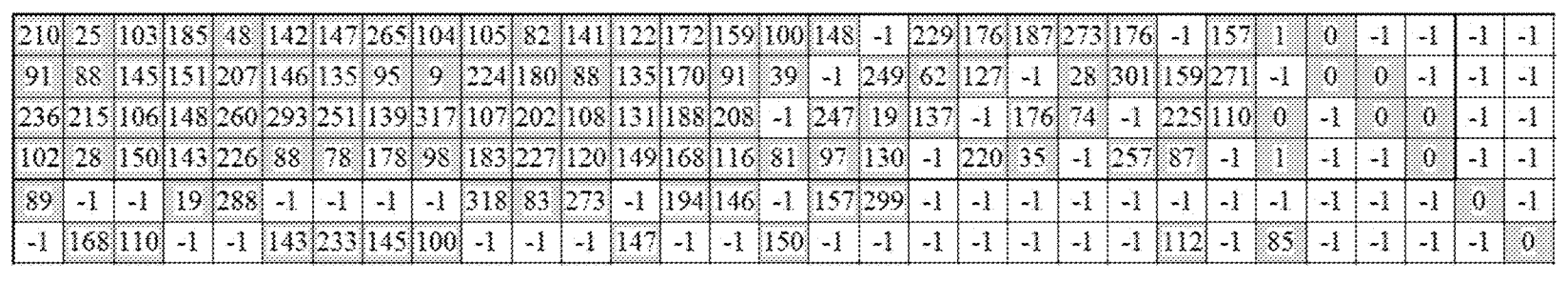
Figure 11B:
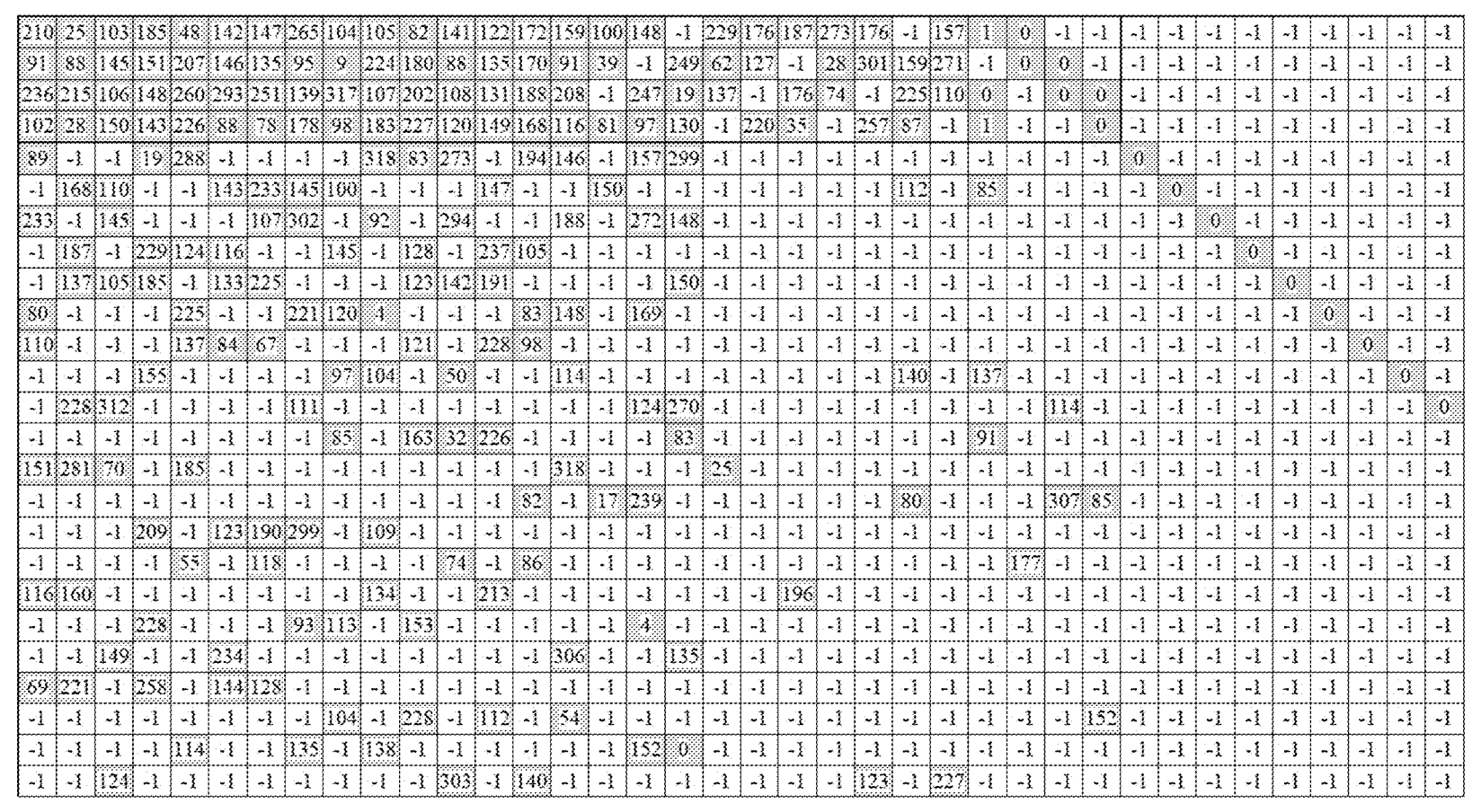
Figure 12A:
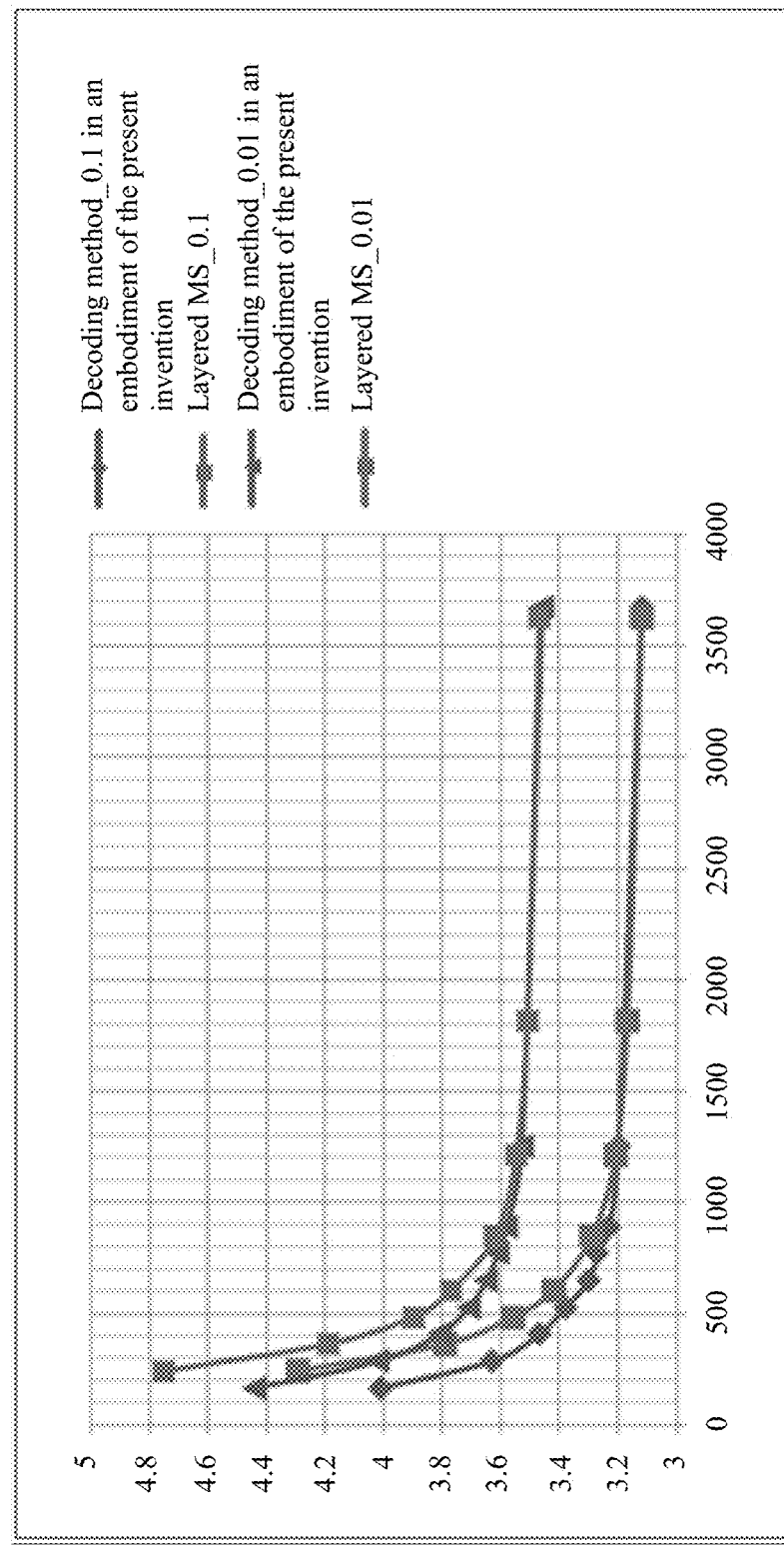
FIG. 12A and FIG. 12B are schematic diagrams of effects, of a decoding method, for increasing a convergence speed and saving a computing resource according to an embodiment of this application.
Figure 12B:
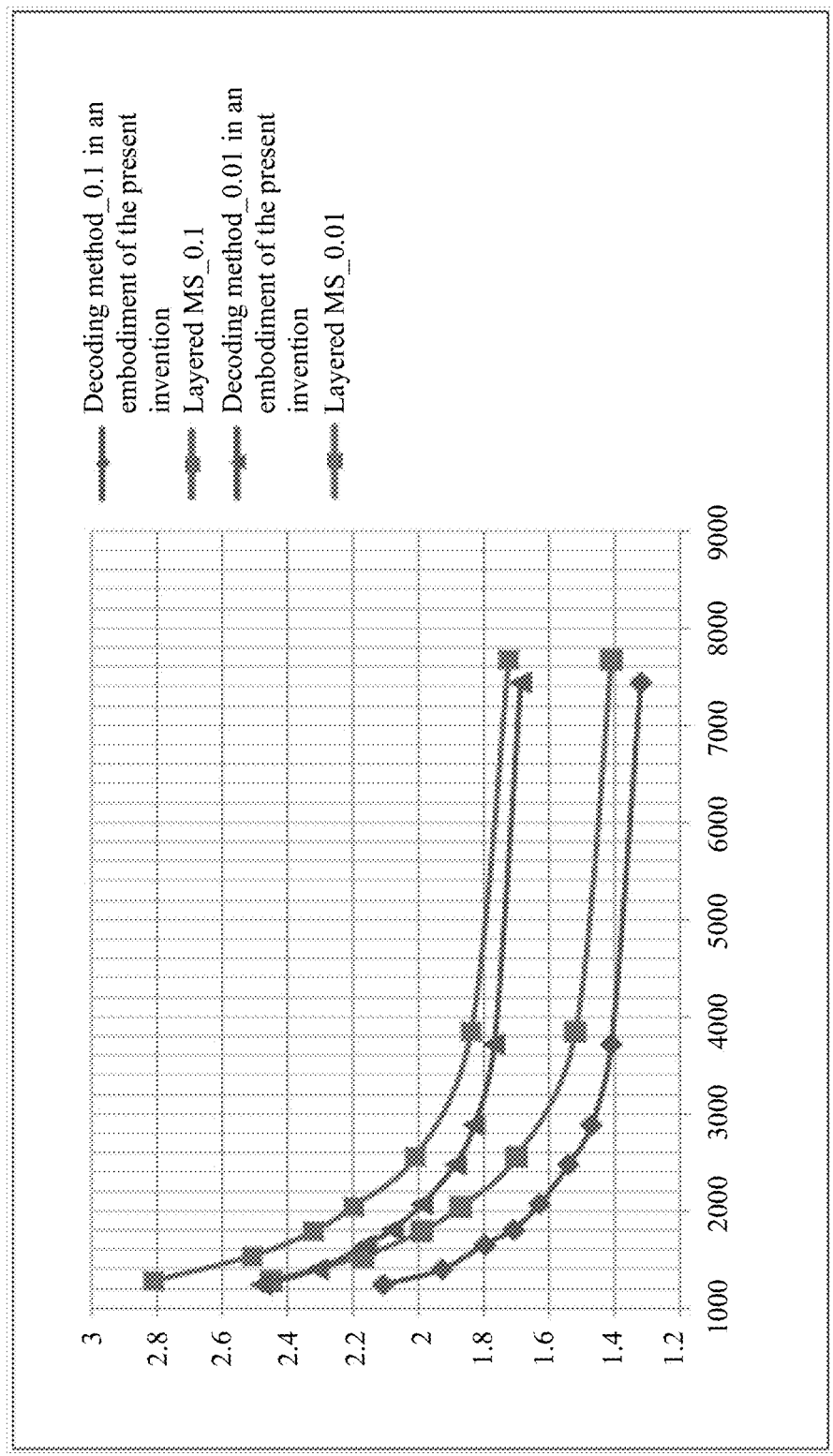

To verify effects that a convergence speed can be increased and a computing resource can be saved in a decoding process in the data transmission method provided in this embodiment of this application, a quasi-cyclic LDPC matrix shown in FIG. 11A and FIG. 11B is used as an example for description. An identity matrix at a lower right corner in a matrix in FIG. 11B is omitted in the figure due to limited space. A code rate in FIG. 11A is 0.8064, and a code rate in FIG. 10B is 0.5. An expansion factor z=40, and after expansion, a length of a code length information bit k=1000. For comparison, decoding is performed by separately using a layered MS decoding method and the decoding method in this embodiment of this application. Comparison results are shown in FIG. 12A and FIG. 12B. In FIG. 12A and FIG. 12B, lateral axes represent equivalent complexity required for decoding, a product of a quantity of elements in the matrix and a quantity of iterations of these elements is used as a criterion herein; and vertical axes represent gains (Eb/N0) required for reaching a (0.1 or 0.01) block error rate (Block error rate, BLER). It can be learned from a simulation result that for a part whose total quantity of computations is relatively small, the method in this embodiment of this application has a larger gain than the layered MS decoding method. As a quantity of computations increases, performance of the two methods may approach each other gradually.

Based on the data transmission method in the foregoing embodiment, an embodiment of this application further provides a data sending device and a data receiving device. It may be understood that, to implement the foregoing functions, the sending device and the receiving device include corresponding hardware structures and/or software modules for performing the functions. Units and algorithm operations of examples described with reference to this embodiment disclosed in this application may be implemented by hardware or a combination of hardware and computer software in this embodiment of this application. Whether a function is performed by hardware or hardware driven by computer software depends on particular applications and design constraints of the technical solutions. For each particular application, a person skilled in the art may use different methods to implement the described functions, but it should not be considered that the implementation goes beyond the scope of the technical solution of this embodiment of this application.

In one embodiment, functional unit division may be performed on the sending device and the receiving device based on the examples of the method. For example, functional units may be divided based on corresponding functions, or two or more than two functions may be integrated into one processing unit. The integrated unit may be implemented in a form of hardware, or may be implemented in a form of a software functional unit. It should be noted that the unit division in this embodiment of this application is an example, and is merely logical function division, and may be other division in actual implementation.

Figure 13:
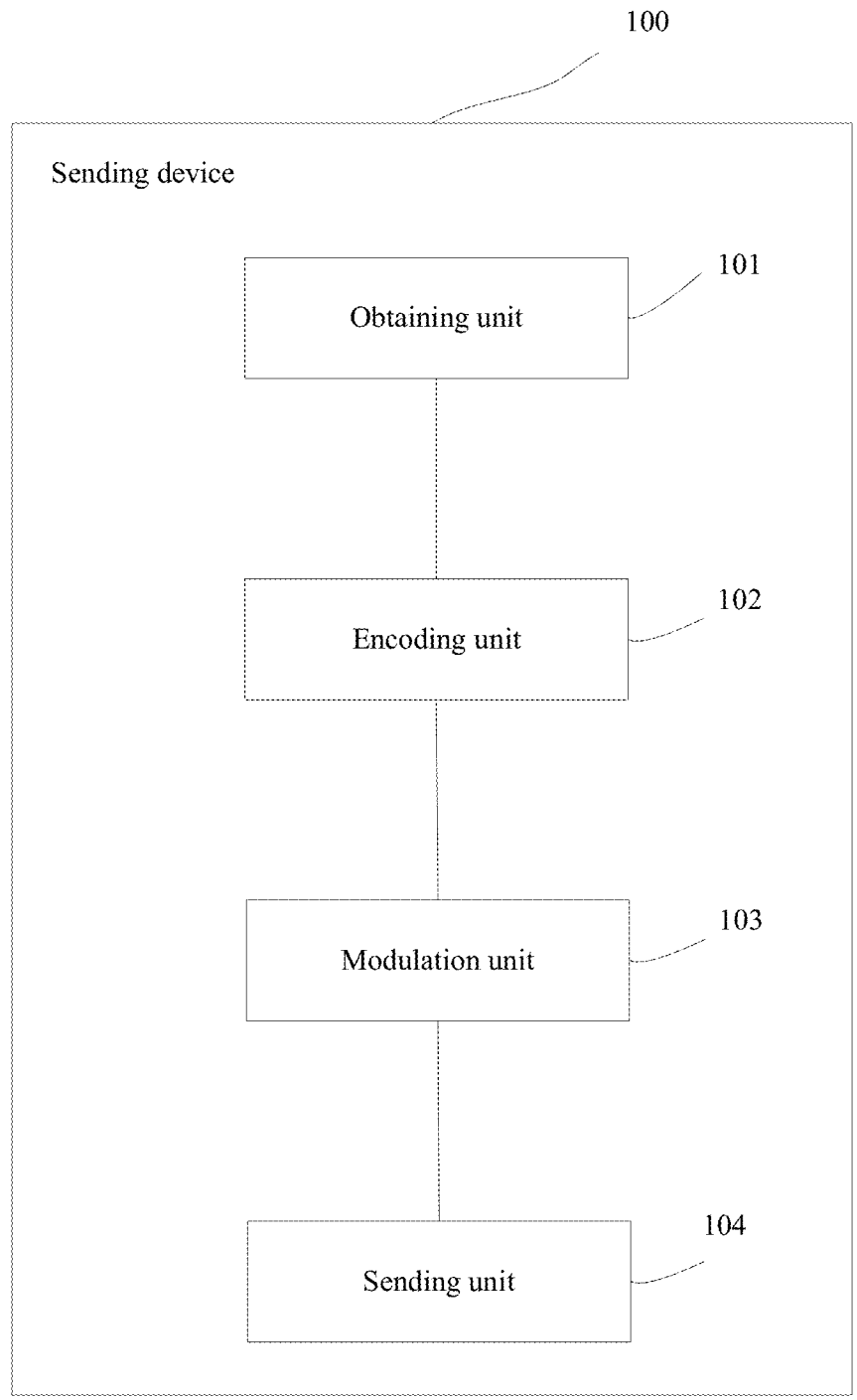
FIG. 13 is a schematic structural diagram of a sending device according to an embodiment of this application.

When an integrated unit is used, FIG. 13 is a schematic structural diagram of a sending device. Referring to FIG. 13, the sending device 100 includes an obtaining unit 101, an encoding unit 102, a modulation unit 103, and a sending unit 104. The obtaining unit 101 is configured to obtain information data. The encoding unit 102 is configured to encode, by using a quasi-cyclic LDPC matrix, the information data obtained by the obtaining unit 101, where in the quasi-cyclic LDPC matrix, a row weight of a row (H−1) is greater than or equal to a row weight of a row H, or a row weight of a row (H−1) is less than or equal to a row weight of a row H, where H is an integer and 0≤H≤M−1, and M represents a quantity of rows in the quasi-cyclic LDPC matrix; the row weight represents a quantity of target elements in each row in the quasi-cyclic LDPC matrix; and a non-zero matrix is obtained after a matrix represented by the target elements is expanded. The modulation unit 103 is configured to modulate the information data encoded by the encoding unit 102, to obtain first data. The sending unit 104 is configured to send the first data obtained through modulation by the modulation unit 103.

In the quasi-cyclic LDPC matrix, the row weight of the row (H−1) is less than or equal to the row weight of the row H, where H is an integer and 0≤H≤M−1, and M represents a quantity of rows in the quasi-cyclic LDPC matrix. The quasi-cyclic LDPC matrix may be a quasi-cyclic LDPC matrix of a raptor-like structure.

In the quasi-cyclic LDPC matrix, the row weight of the row (H−1) is greater than or equal to the row weight of the row H, where H is an integer and 0≤H≤M−1, and M represents a quantity of rows in the quasi-cyclic LDPC matrix. The quasi-cyclic LDPC matrix may be a quasi-cyclic LDPC matrix, transposed in a column direction, of a raptor-like structure.

Figure 14:
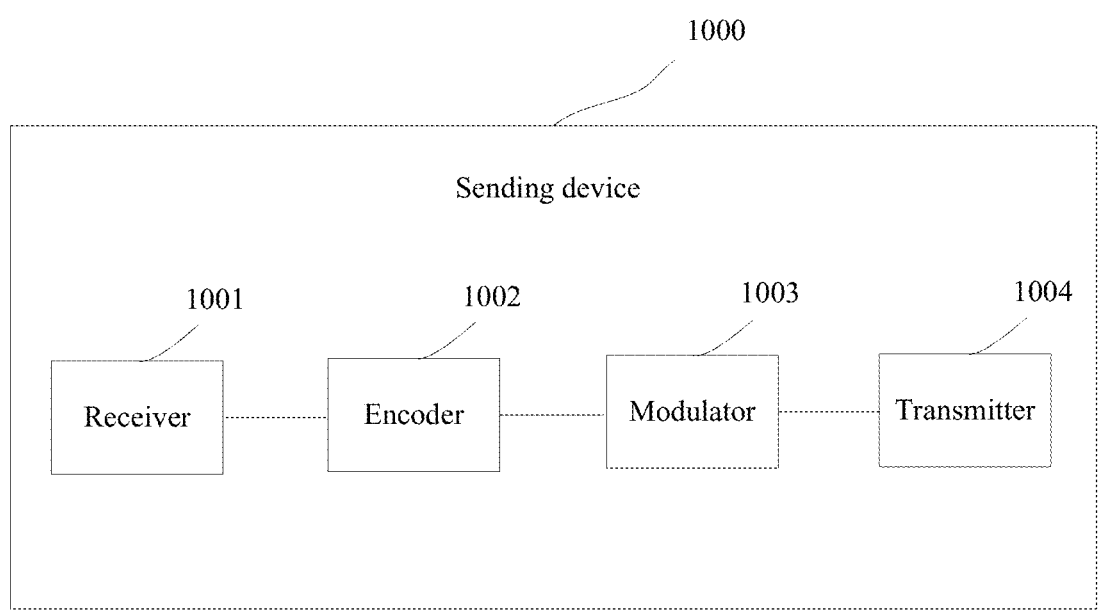
FIG. 14 is a schematic structural diagram of another sending device according to an embodiment of this application.

When a form of hardware is used for implementation, in one embodiment, the obtaining unit 101 may be a receiver, the encoding unit 102 may be an encoder, the modulation unit 103 may be a modulator, and the sending unit 104 may be a transmitter. FIG. 14 is a schematic structural diagram of another sending device according to an embodiment of this application. Referring to FIG. 14, the sending device 1000 includes a receiver 1001, an encoder 1002, a modulator 1003, and a transmitter 1004.

The receiver 1001, having a same function as the obtaining unit 1001, is configured to obtain information data, the encoder 1002, having a same function as the encoding unit 102, is configured to implement a function of encoding, by using a quasi-cyclic LDPC matrix, the information data obtained by the receiver. The modulator 1003, having a same function as the modulation unit 103, is configured to implement a function of modulating the information data encoded by the encoder 1002 to obtain first data. The transmitter 1004, having a same function as the sending unit 104, is configured to implement a function of sending the first data obtained through modulation by the modulator 1003. For specific functions of the receiver 1001, the encoder 1002, the modulator 1003, and the transmitter 1004 in the sending device 1000, refer to the description of the sending device 100 in the foregoing embodiment. Detailed are not repeated herein.

In one embodiment, the sending device 100 and the sending device 1000 have a same data transmission function as the sending device in the foregoing method embodiment. For content that is not described in detail in this embodiment of this application, refer to the related description in the foregoing embodiment. Detailed are not described in this embodiment of this application.

Figure 15:
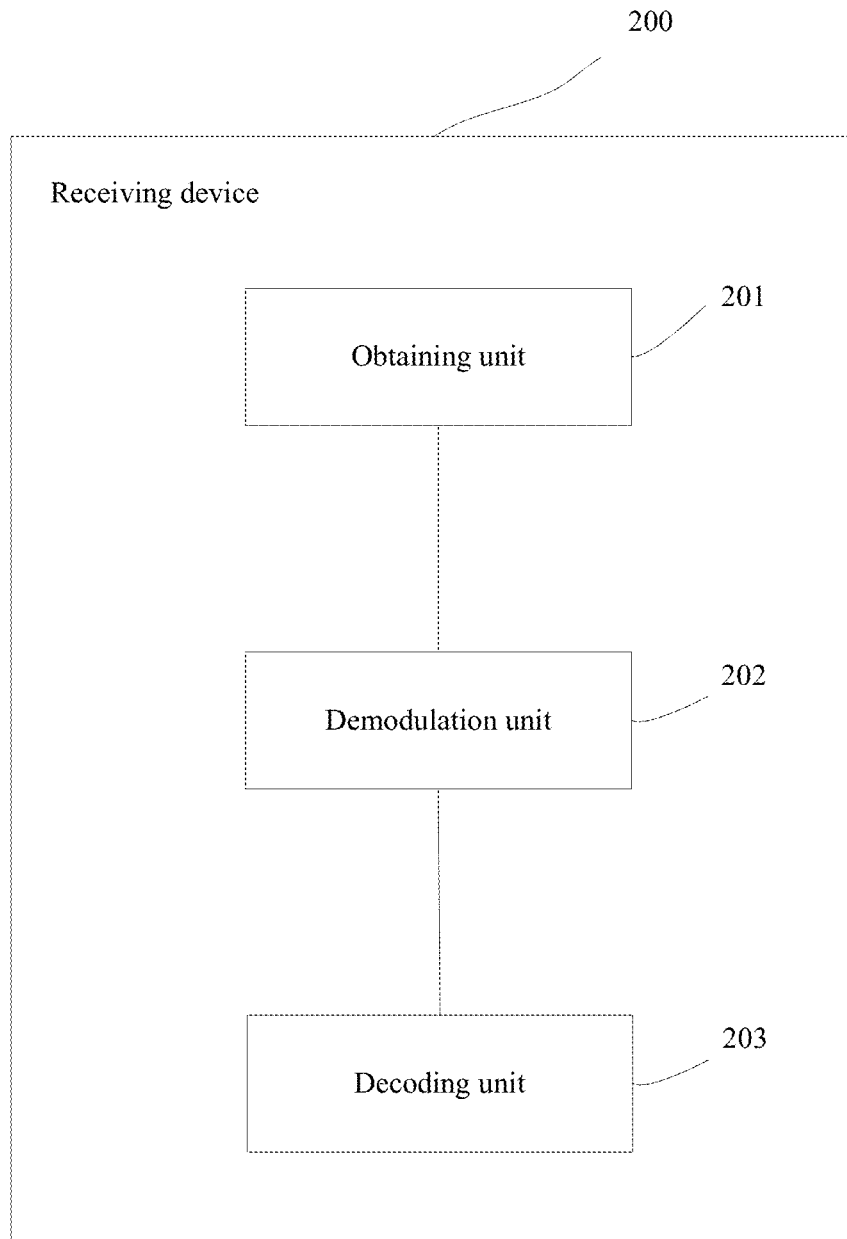
FIG. 15 is a schematic structural diagram of a receiving device according to an embodiment of this application.

When an integrated unit is used, FIG. 15 is a schematic structural diagram of a receiving device. Referring to FIG. 15, the receiving device 200 includes an obtaining unit 201, a demodulation unit 202, and a decoding unit 203. The obtaining unit 201 is configured to obtain second data. The demodulation unit 202 is configured to demodulate the second data obtained by the obtaining unit 201, to obtain to-be-decoded data. The decoding unit 203 is configured to decode, by using a block matrix in a quasi-cyclic LDPC matrix, the to-be-decoded data obtained through demodulation by the demodulation unit 202, where the block matrix is a submatrix in the quasi-cyclic LDPC matrix.

In one embodiment, the quasi-cyclic LDPC matrix is a quasi-cyclic LDPC matrix of a raptor-like structure. The decoding unit 203 decodes the to-to-decoded data in the following manner by using the block matrix in the quasi-cyclic LDPC matrix:

The to-be-decoded data is decoded through a first specified quantity of iterations by using a block matrix including rows $M_C$ to (M−1) and columns 0 to N in the quasi-cyclic LDPC matrix of the raptor-like structure, to obtain intermediate data of iterative decoding; and the intermediate data of iterative decoding is decoded through a second specified quantity of iterations by sequentially using a block matrix including rows 0 to ($M_C$−1) and the columns 0 to N and the block matrix including the rows $M_C$ to (M−1) and the columns 0 to N in the quasi-cyclic LDPC matrix of the raptor-like structure, where M represents a quantity of rows in the quasi-cyclic LDPC matrix of the raptor-like structure, N represents a quantity of columns in the quasi-cyclic LDPC matrix of the raptor-like structure, $M_C$ represents a quantity of rows in a core matrix in the quasi-cyclic LDPC matrix of the raptor-like structure, and a column in which a non-negative element in any row of the core matrix is located includes at least two non-negative elements, where $M_C$<M, and M, N, and $M_C$ are all positive integers.

In the quasi-cyclic LDPC matrix, a row weight of a row (H−1) is less than or equal to a row weight of a row H, where H is an integer and 0≤H≤M−1, and M represents a quantity of rows in the quasi-cyclic LDPC matrix. The row weight represents a quantity of target elements in each row in the quasi-cyclic LDPC matrix, and a non-zero matrix is obtained after a matrix represented by the target elements is expanded.

In another embodiment, in the quasi-cyclic LDPC matrix, a row weight of a row (H−1) is greater than or equal to a row weight of a row H, where H is an integer and 0≤H≤M−1, and M represents a quantity of rows in the quasi-cyclic LDPC matrix. The quasi-cyclic LDPC matrix is a quasi-cyclic LDPC matrix, transposed in a column direction, of a raptor-like structure.

The decoding unit 203 decodes the to-to-decoded data in the following manner by using the block matrix in the quasi-cyclic LDPC matrix:

The to-be-decoded data is decoded through a first specified quantity of iterations by using a block matrix including rows 0 to (M−$M_C$−1) and columns 0 to N in the quasi-cyclic LDPC matrix, transposed in the column direction, of the raptor-like structure, to obtain intermediate data of iterative decoding; and the intermediate data of the iterative decoding is decoded through a second specified quantity of iterations by sequentially using the block matrix including the rows 0 to (M−$M_C$−1) and the columns 0 to N and a block matrix including rows $M_C$ to (M−1) and the columns 0 to N in the quasi-cyclic LDPC matrix, transposed in the column direction, of the raptor-like structure, where M represents a quantity of rows in the quasi-cyclic LDPC matrix, transposed in the column direction, of the raptor-like structure, N represents a quantity of columns in the quasi-cyclic LDPC matrix, transposed in the column direction, of the raptor-like structure, $M_C$ represents a quantity of rows in a core matrix in the quasi-cyclic LDPC matrix, transposed in the column direction, of the raptor-like structure, and a column in which a non-negative element in any row of the core matrix is located includes at least two non-negative elements, $M_C$<M, and M, N, and $M_C$ are all positive integers.

In another embodiment, the decoding unit 203 is further configured to: after decoding the to-be-decoded data each time, terminate iterative decoding if decoding succeeds.

Figure 16:
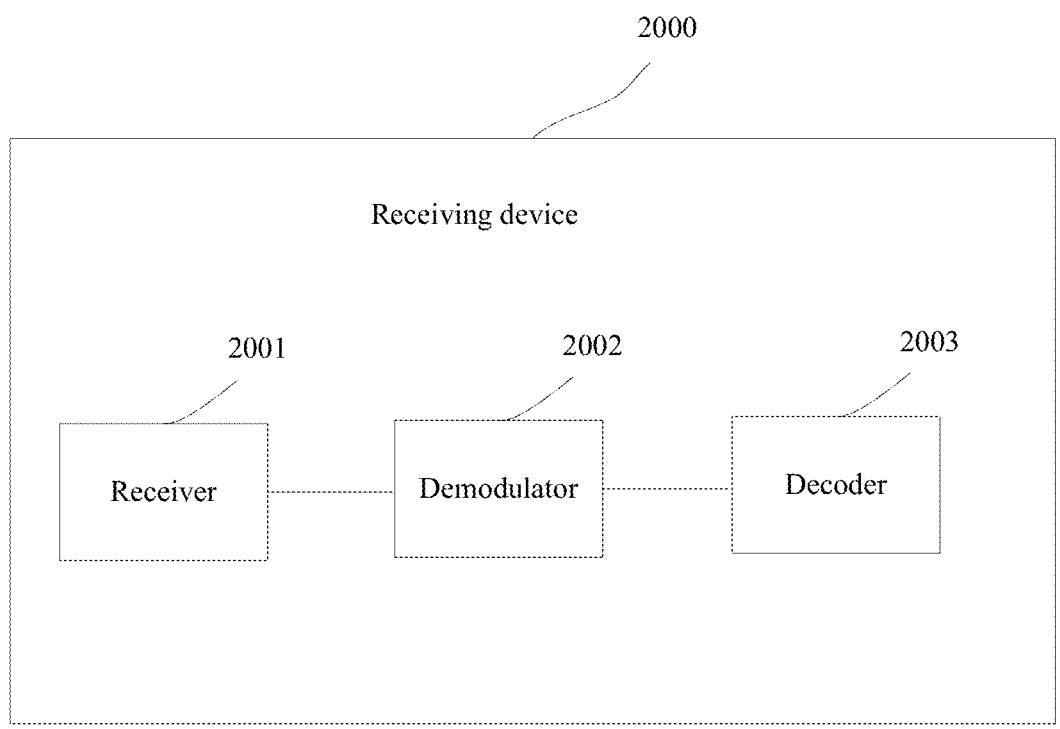
FIG. 16 is a schematic structural diagram of another receiving device according to an embodiment of this application.

When a form of hardware is used for implementation, in an embodiment of this application, the obtaining unit 201 may be a receiver, the demodulation unit 202 may be a demodulator, and the decoding unit 203 may be a decoder. FIG. 16 is another schematic structural diagram of another receiving device according to an embodiment of this application. Referring to FIG. 16, a receiving device 2000 includes a receiver 2001, a demodulator 2002, and a decoder 2003.

The receiver 2001, having a same function as the obtaining unit 201, is configured to obtain a second signal. The demodulator 2002, having a same function as the demodulation unit 202, is configured to implement a function of demodulating second data to obtain to-be-decoded data. The decoder 2003, having a same function as the decoding unit 203, is configured to implement a function of decoding the to-be-decoded data by using a block matrix in a quasi-cyclic LDPC matrix. For specific functions of the receiver 2001, the demodulator 2002, and the decoder 2003 in the receiving device 2000, refer to the description of the receiving device 200 in the foregoing embodiment. Detailed are not repeated herein.

In one embodiment, the receiving device 200 and the receiving device 2000 have a same data transmission function as the receiving device in the foregoing method embodiment. For content that is not described in detail in this embodiment of this application, refer to the related description in the foregoing embodiment. Detailed are not described in this embodiment of this application.

A person of ordinary skill in the art may understand that all or some of the operations in the foregoing method of the embodiments may be implemented by a program instructing a processor. The program may be stored in a computer readable storage medium. The storage medium may be a non-transitory medium, such as a random-access memory, read-only memory, a flash memory, a hard disk, a solid state drive, a magnetic tape, a floppy disk, an optical disc, or any combination thereof.

It should be understood that, with reference to the flowcharts and block diagrams of the methods and devices in the embodiments of this application, the computer program instructions may be used to implement each process and each block in the flowcharts and block diagrams and a combination of a process and a block in the flowcharts and the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts or in one or more blocks in the block diagrams.

The foregoing descriptions are merely specific implementations of the embodiments of this application, but are not intended to limit the protection scope of the embodiments of this application. Any variation or replacement readily figured out by a person skilled in the art within the technical scope disclosed in the embodiments of this application shall fall within the protection scope of the embodiments of this application.

What is claimed is:

1. A data transmission method, comprising:
obtaining, by a sending device, information data;
encoding, by the sending device, the information data using a quasi-cyclic low-density parity-check (LDPC) code matrix, wherein in the quasi-cyclic LDPC matrix, a row weight of a row (H−1) is greater than or equal to a row weight of a row H, or a row weight of a row (H−1) is less than or equal to a row weight of a row H, wherein H is an integer and 0≤H≤M−1, and M represents a quantity of rows in the quasi-cyclic LDPC matrix, wherein a row weight represents a quantity of non-zero elements of a corresponding row in the quasi-cyclic LDPC matrix;
obtaining a non-zero matrix after expanding a matrix represented by the non-zero elements;
modulating, by the sending device, the encoded information data to obtain modulated data; and
sending, by the sending device, the modulated data.

2. The method according to claim 1, wherein in the quasi-cyclic LDPC matrix, the row weight of the row (H−1) is less than or equal to the row weight of the row H, and the quasi-cyclic LDPC matrix is a quasi-cyclic LDPC matrix of a raptor structure.

3. The method according to claim 1, wherein in the quasi-cyclic LDPC matrix, the row weight of the row (H−1) is greater than or equal to the row weight of the row H, and the quasi-cyclic LDPC matrix is a quasi-cyclic LDPC matrix, transposed in a column direction, of a raptor structure.

4. A data receiving method, comprising:
obtaining, by a receiving device, data from a sending device, and demodulating the data to obtain demodulated data; and
decoding, by the receiving device, the demodulated data using a block matrix in a quasi-cyclic low-density parity-check (LDPC) code matrix, wherein the block matrix is a submatrix in the quasi-cyclic LDPC matrix.

5. The method according to claim 4, wherein the quasi-cyclic LDPC matrix is a quasi-cyclic LDPC matrix of a raptor structure; and
wherein the decoding the demodulated data using a block matrix in a quasi-cyclic LDPC matrix comprises:
decoding the demodulated data through a first specified quantity of iterations using a block matrix comprising rows $M_C$ to (M−1) and columns 0 to N in the quasi-cyclic LDPC matrix of the raptor structure, to obtain intermediate data of iterative decoding; and
decoding the intermediate data of iterative decoding through a second specified quantity of iterations by sequentially using a block matrix comprising rows 0 to ($M_C$−1) and the columns 0 to N and the block matrix comprising the rows $M_C$ to (M−1) and the columns 0 to N in the quasi-cyclic LDPC matrix of the raptor structure, wherein
M represents a quantity of rows in the quasi-cyclic LDPC matrix of the raptor structure, N represents a quantity of columns in the quasi-cyclic LDPC matrix of the raptor structure, $M_C$ represents a quantity of rows in a core matrix in the quasi-cyclic LDPC matrix of the raptor structure, and a column in which a specified element in any row of the core matrix is located comprises at least two specified elements, wherein
$M_C$<M, and M, N, and $M_C$ are all positive integers.

6. The method according to claim 4, wherein in the quasi-cyclic LDPC matrix, a row weight of a row (H−1) is less than or equal to a row weight of a row H, wherein H is an integer and 0≤H≤M−1, and M represents a quantity of rows in the quasi-cyclic LDPC matrix, wherein the row weight represents a quantity of non-zero elements of a corresponding row in the quasi-cyclic LDPC matrix; and a non-zero matrix is obtained after a matrix represented by target elements is expanded.

7. The method according to claim 4, wherein in the quasi-cyclic LDPC matrix, a row weight of a row (H−1) is greater than or equal to a row weight of a row H, wherein H is an integer and 0≤H≤M−1, and M represents a quantity of rows in the quasi-cyclic LDPC matrix, wherein the row weight represents a quantity of non-zero elements of a corresponding row in the quasi-cyclic LDPC matrix.

8. The method according to claim 7, wherein the quasi-cyclic LDPC matrix is a quasi-cyclic LDPC matrix, transposed in a column direction, of a raptor structure.

9. The method according to claim 8, wherein the decoding the demodulated data using a block matrix in a quasi-cyclic LDPC matrix comprises:
decoding the demodulated data through a first specified quantity of iterations using a block matrix comprising rows 0 to (M−$M_C$−1) and columns 0 to N in the quasi-cyclic LDPC matrix, transposed in the column direction, of the raptor structure, to obtain intermediate data of iterative decoding; and
decoding the intermediate data of iterative decoding through a second specified quantity of iterations by sequentially using the block matrix comprising the rows 0 to (M−$M_C$−1) and the columns 0 to N and a block matrix comprising rows $M_C$ to (M−1) and the columns 0 to N in the quasi-cyclic LDPC matrix, transposed in the column direction, of the raptor structure, wherein
M represents a quantity of rows in the quasi-cyclic LDPC matrix, transposed in the column direction, of the raptor structure, N represents a quantity of columns in the quasi-cyclic LDPC matrix, transposed in the column direction, of the raptor structure, $M_C$ represents a quantity of rows in a core matrix in the quasi-cyclic LDPC matrix, transposed in the column direction, of the raptor structure, and a column in which a non-negative element in any row of the core matrix is located comprises at least two non-negative elements, wherein
$M_C$<M, $N_C$<N, and M, N, and $M_C$ are all positive integers.

10. The method according to claim 4, wherein after the decoding the demodulated data each time, the method further comprises:
terminating iterative decoding if decoding succeeds.

11. A receiving device, comprising:
an obtaining unit configured to obtain data from a sending device;
a demodulation unit configured to demodulate the second data obtained by the obtaining unit to obtain demodulated data; and
a decoding unit configured to decode, by using a block matrix in a quasi-cyclic low-density parity-check (LDPC) code matrix, the demodulated data obtained through demodulation by the demodulation unit, wherein the block matrix is a submatrix in the quasi-cyclic LDPC matrix.

12. The receiving device according to claim 11, wherein the quasi-cyclic LDPC matrix is a quasi-cyclic LDPC matrix of a raptor structure; and wherein the decoding unit performs decoding to-to-decoded data using the block matrix in the quasi-cyclic LDPC matrix, including:

decoding the demodulated data through a first specified quantity of iterations using a block matrix comprising rows $M_C$ to $(M-1)$ and columns 0 to N in the quasi-cyclic LDPC matrix of the raptor structure, to obtain intermediate data of iterative decoding; and decoding the intermediate data of iterative decoding through a second specified quantity of iterations by sequentially using a block matrix comprising rows 0 to $(M_C-1)$ and the columns 0 to N and the block matrix comprising the rows $M_C$ to $(M-1)$ and the columns 0 to N in the quasi-cyclic LDPC matrix of the raptor structure, wherein M represents a quantity of rows in the quasi-cyclic LDPC matrix of the raptor structure, N represents a quantity of columns in the quasi-cyclic LDPC matrix of the raptor structure, $M_C$ represents a quantity of rows in a core matrix in the quasi-cyclic LDPC matrix of the raptor structure, and a column in which a non-negative element in any row of the core matrix is located comprises at least two non-negative elements, wherein $M_C<M$, and M, N, and $M_C$ are all positive integers.

13. The receiving device according to claim 11, wherein in the quasi-cyclic LDPC matrix, a row weight of a row $(H-1)$ is less than or equal to a row weight of a row H, wherein H is an integer and $0 \leq H \leq M-1$, and M represents a quantity of rows in the quasi-cyclic LDPC matrix, wherein the row weight represents a quantity of non-zero elements of a corresponding row in the quasi-cyclic LDPC matrix; and a non-zero matrix is obtained after a matrix represented by the target elements is expanded.

14. The receiving device according to claim 11, wherein in the quasi-cyclic LDPC matrix, a row weight of a row $(H-1)$ is greater than or equal to a row weight of a row H, wherein H is an integer and $0 \leq H \leq M-1$, and M represents a quantity of rows in the quasi-cyclic LDPC matrix, wherein the row weight represents a quantity of non-zero elements of a corresponding row in the quasi-cyclic LDPC matrix.

15. The receiving device according to claim 14, wherein the quasi-cyclic LDPC matrix is a quasi-cyclic LDPC matrix, transposed in a column direction, of a raptor structure.

16. The receiving device according to claim 15, wherein the decoding unit performs decoding to-to-decoded data using the block matrix in the quasi-cyclic LDPC matrix, including:

decoding the demodulated data through a first specified quantity of iterations by using a block matrix comprising rows 0 to $(M-M_C-1)$ and columns 0 to N in the quasi-cyclic LDPC matrix, transposed in the column direction, of the raptor structure, to obtain intermediate data of iterative decoding; and decoding the intermediate data of iterative decoding through a second specified quantity of iterations by sequentially using the block matrix comprising the rows 0 to $(M-M_C-1)$ and the columns 0 to N and a block matrix comprising rows $M_C$ to $(M-1)$ and the columns 0 to N in the quasi-cyclic LDPC matrix, transposed in the column direction, of the raptor structure, wherein M represents a quantity of rows in the quasi-cyclic LDPC matrix, transposed in the column direction, of the raptor structure, N represents a quantity of columns in the quasi-cyclic LDPC matrix, transposed in the column direction, of the raptor structure, $M_C$ represents a quantity of rows in a core matrix in the quasi-cyclic LDPC matrix, transposed in the column direction, of the raptor structure, and a column in which a non-negative element in any row of the core matrix is located comprises at least two non-negative elements, wherein $M_C<M$, and M, N, and $M_C$ are all positive integers.

17. The receiving device according to claim 11, wherein the decoding unit is further configured to:

after decoding the demodulated data each time, terminate iterative decoding if decoding succeeds.

* * * * *

UNITED STATES PATENT AND TRADEMARK OFFICE
CERTIFICATE OF CORRECTION

PATENT NO. : 10,944,427 B2
APPLICATION NO. : 16/436912
DATED : March 9, 2021
INVENTOR(S) : Liang Ma and Yuejun Wei Page 1 of 1

It is certified that error appears in the above-identified patent and that said Letters Patent is hereby corrected as shown below:

In the Claims

In Claim 11, Column 20, Line 56-67, delete "demodulate the second data" and insert -- demodulate the data --.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*